(12) United States Patent  (10) Patent No.: US 7,718,487 B2
Kijima  (45) Date of Patent: May 18, 2010

(54) METHOD OF MANUFACTURING FERROELECTRIC LAYER AND METHOD OF MANUFACTURING ELECTRONIC INSTRUMENT

(75) Inventor: Takeshi Kijima, Matsumoto (JP)

(73) Assignee: Seiko Epson Corporation (JP)

( * ) Notice: Subject to any disclaimer, the term of this patent is extended or adjusted under 35 U.S.C. 154(b) by 440 days.

(21) Appl. No.: 11/413,145

(22) Filed: Apr. 27, 2006

(65) Prior Publication Data

US 2006/0275930 A1 Dec. 7, 2006

(30) Foreign Application Priority Data

Jun. 2, 2005 (JP) ............................. 2005-162542

(51) Int. Cl.
H01L 21/8242 (2006.01)
H01L 21/00 (2006.01)

(52) U.S. Cl. .................. 438/240; 438/2; 257/E21.272; 257/E21.664

(58) Field of Classification Search ...................... 438/3, 438/240; 257/E21.001, E21.002, E21.272, 257/E21.664
See application file for complete search history.

(56) References Cited

U.S. PATENT DOCUMENTS

| 5,719,417 | A | 2/1998 | Roeder et al. |
| 5,978,207 | A | 11/1999 | Anderson et al. |
| 6,172,386 | B1 * | 1/2001 | Jung et al. ................. 257/295 |
| 6,358,811 | B1 | 3/2002 | Kim |
| 6,855,974 | B2 | 2/2005 | Matsuura et al. |
| 7,037,731 | B2 | 5/2006 | Kijima et al. |
| 7,148,530 | B2 | 12/2006 | Shin et al. |
| 7,247,504 | B2 | 7/2007 | Matsuura et al. |

| 2004/0197937 | A1 * | 10/2004 | Fujimori ...................... 438/3 |
| 2004/0214352 | A1 | 10/2004 | Kijima et al. |
| 2004/0256648 | A1 | 12/2004 | Karasawa et al. |
| 2006/0083933 | A1 | 4/2006 | Kijima et al. |
| 2006/0088731 | A1 | 4/2006 | Kijima et al. |
| 2006/0261388 | A1 | 11/2006 | Shin et al. |

FOREIGN PATENT DOCUMENTS

| CN | 1267654 A | 9/2000 |
| CN | 1319256 A | 10/2001 |
| CN | 1519939 A | 8/2004 |
| EP | 1 320 125 A2 | 6/2003 |
| JP | 2004-214569 | 7/2004 |
| JP | 2004-296919 | 10/2004 |
| JP | 2005-057065 | 3/2005 |
| JP | 2005-100660 | 4/2005 |
| JP | 2006-151785 | 6/2006 |
| KR | 10-2004-0001901 | 1/2004 |

(Continued)

OTHER PUBLICATIONS

Vossen and Kern Thin Film Processes II 1991 Academic Press p. 371.*

(Continued)

*Primary Examiner*—David S Blum
(74) *Attorney, Agent, or Firm*—Harness, Dickey & Pierce, P.L.C.

(57) ABSTRACT

A method of manufacturing a ferroelectric layer, including: forming a first ferroelectric layer above a base by a vapor phase method; and forming a second ferroelectric layer above the first ferroelectric layer by a liquid phase method.

11 Claims, 20 Drawing Sheets

LINEAR SATURATED POLYCARBOXYLIC ACID

FOREIGN PATENT DOCUMENTS

| KR | 10-2004-0070564 | 8/2004 |
|---|---|---|
| WO | WO 00/17936 | 3/2000 |

OTHER PUBLICATIONS

Shimizu, Masaru; "Effects of the utilization of a buffer layer on the growth of Pb(Zr, Ti)O3 thin films by metalorganic chemical vapor deposition", Journal of Crystal Growth, 1994, pp. 226-231.

Communication from European Patent Office re: related application.

Hiromu Miyazawa, et al., "Electronic States of Perovskite-Type Oxides and Ferroelectricity", Jpn. J. Appl. Phys., vol. 39, pp. 5679-5682 (2000).

Jungho Ryu, et al., "Effect of Heating Rate on the Sintering Behavior and the Piezoelectric Properties of Lead Zirconate Titanate Ceramics", J. Am. Ceram. Soc., vol. 84, No. 4, pp. 902-904 (2001).

L. Bellaiche, et al., "Intrinsic Piezoelectric Response in Perovskite Alloys: PMN-PT versus PZT", The American Physical Society, vol. 83, No. 7, pp. 1347-1350 (1999).

* cited by examiner

LEAD OCTYLATE

NIOBIUM OCTYLATE

NIOBIUM LEAD OCTYLATE

DIMETHYL SUCCINATE

DIETHYL SUCCINATE

LINEAR SATURATED POLYCARBOXYLIC ACID

DIBUTYL OXALATE

DIMETHYL MALONATE

DIMETHYL ADIPATE

TRIBUTYL CITRATE

TRIETHYL 1,1,2-ETHANETRICARBOXYLATE

TETRAETHYL 1,1,2,2-ETHANETETRACARBOXYLATE

LINEAR UNSATURATED POLYCARBOXYLIC ACID

DIMETHYL MALEATE

DIETHYL FUMARATE

TRANS-ACONITIC ACID

CYCLIC POLYCARBOXYLIC ACID

TRIMESIC ACID

PYROMELLITIC ACID

TRIMETHYL 1,2,4-BENZENETRICARBOXYLATE 1,2,3,4-CYCLOPENTANETETRACARBOXYLIC ACID

METHOD OF MANUFACTURING FERROELECTRIC LAYER AND METHOD OF MANUFACTURING ELECTRONIC INSTRUMENT

Japanese Patent Application No. 2005-162542, filed on Jun. 2, 2005, is hereby incorporated by reference in its entirety.

BACKGROUND OF THE INVENTION

The present invention relates to a method of manufacturing a ferroelectric layer and a method of manufacturing an electronic instrument.

A ferroelectric such as PZT ($Pb(Zr,Ti)O_3$) has been used for various applications such as a ferroelectric memory, a piezoelectric device, an infrared sensor, and a surface acoustic wave (SAW) device, and has been extensively researched and developed.

As a typical method for forming a ferroelectric, a chemical solution deposition (CSD) method (liquid phase method) such as a sol-gel method or a metalorganic deposition (MOD) method has been known.

The sol-gel method utilizes a solution of a precursor prepared by polymerizing a compound such as a metal alkoxide by hydrolysis and polycondensation (hereinafter may be called "hydrolysis-condensation"). The sol-gel method has an advantage in that a ferroelectric can be obtained with excellent composition controllability by controlling the composition of a metal alkoxide solution. However, since the hydrolysis-condensation reaction is an irreversible reaction, a metal alkoxide which has been crosslinked and polymerized cannot be used as a sol-gel raw material. In particular, when forming a lead-containing ferroelectric such as PZT, it is necessary to process lead waste.

The MOD method utilizes a solution of a stable organometallic compound such as a metal carboxylate. Since the raw material solution used in the MOD method contains a stable organometallic compound as the raw material, it is easy to adjust the solution composition and to handle the raw material solution. On the other hand, since the MOD method forms a complex oxide by decomposing an organic group having a high molecular weight in an oxygen atmosphere, differing from the sol-gel method which forms a complex oxide by hydrolysis and polycondensation of a compound, the crystallization temperature is increased in comparison with the sol-gel method, whereby the crystal grain size tends to be increased.

For example, when connecting a ferroelectric capacitor and a MOS transistor using a tungsten plug, a stacked ferroelectric capacitor having a multilayer structure is used. When forming a ferroelectric layer of the stacked ferroelectric capacitor by the chemical solution method, the following problem occurs. Specifically, a complicated multilayer structure is employed for a lower electrode of the stacked ferroelectric capacitor in order to secure barrier properties for the tungsten plug in the lower layer to prevent oxidation of tungsten. For example, the lower electrode is formed by stacking a nitride layer such as titanium nitride or titanium aluminum nitride, an iridium layer, an iridium oxide layer, and the like on the tungsten plug, and forming a platinum layer on the iridium layer. Since the lower electrode having such a structure cannot allow formation of a platinum layer exhibiting excellent crystal orientation, it is difficult to form a ferroelectric layer exhibiting excellent orientation on the platinum layer when using a known sol-gel method or the like.

SUMMARY

According to a first aspect of the invention, there is provided a method of manufacturing a ferroelectric layer, comprising:

forming a first ferroelectric layer above a base by a vapor phase method; and forming a second ferroelectric layer above the first ferroelectric layer by a liquid phase method.

According to a second aspect of the invention, there is provided a method of manufacturing an electronic instrument, comprising:

forming a first electrode layer above a base;

forming a first ferroelectric layer above the first electrode layer by a vapor phase method;

forming a second ferroelectric layer above the first ferroelectric layer by a liquid phase method; and forming a second electrode layer above the second ferroelectric layer.

DETAILED DESCRIPTION OF THE EMBODIMENT

Figure 1:
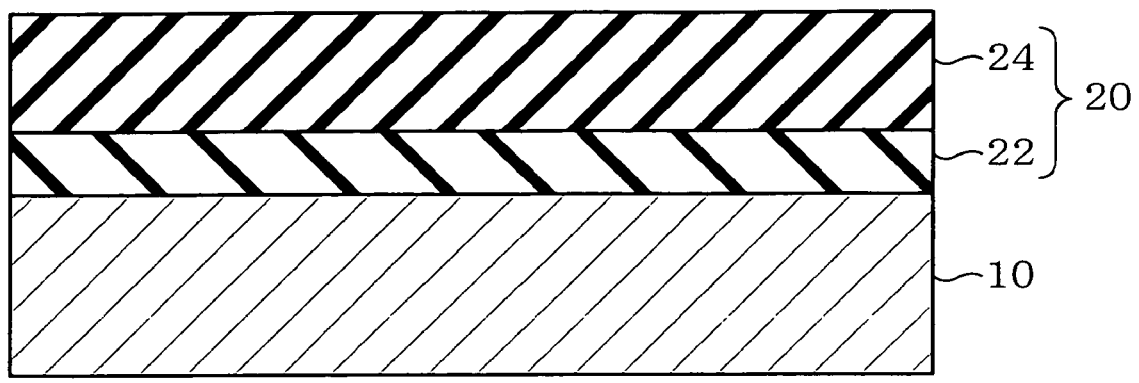
FIG. 1 is a cross-sectional view schematically showing a structure including a ferroelectric layer according to one embodiment of the invention.

The invention may provide a method of manufacturing a ferroelectric layer capable of obtaining a ferroelectric layer exhibiting excellent orientation in the manufacture of a ferroelectric layer of a stacked ferroelectric capacitor or the like, and a ferroelectric layer.

The invention may also provide a method of manufacturing an electronic instrument using the above method of manufacturing a ferroelectric layer.

According to one embodiment of the invention, there is provided a method of manufacturing a ferroelectric layer, comprising:

forming a first ferroelectric layer above a base by a vapor phase method; and forming a second ferroelectric layer above the first ferroelectric layer by a liquid phase method.

This manufacturing method enables a ferroelectric layer exhibiting excellent crystal characteristics (e.g. crystal orientation) to be formed on a base exhibiting poor crystal characteristics.

This method of manufacturing a ferroelectric layer may comprise:

forming an insulating layer above the base, forming a hole in the insulating layer, and forming an electrode layer in the hole, before forming the first ferroelectric layer, wherein the first ferroelectric layer is formed on the electrode layer.

In this method of manufacturing a ferroelectric layer, the second ferroelectric layer may include a ferroelectric shown by a general formula "$AB_{1-x}C_xO_3$";

the element A may include at least Pb;

the element B may include at least one of Zr, Ti, V, W, and Hf; and the element C may include at least one of Nb and Ta.

In this manufacturing method, the second ferroelectric layer may be formed by a sol-gel method or a metal organic decomposition (MOD) method. In this case, it is preferable to use a specific precursor composition given below.

In this method of manufacturing a ferroelectric layer, the second ferroelectric layer may be formed by using a precursor composition including a precursor; and the precursor may include at least the element B and the element C and includes an ester bond.

According to this precursor composition, since the precursor includes an ester bond to allow a reversible reaction, the polymerized precursor can be decomposed. Therefore, the decomposed product can be recycled as the precursor raw material.

In this method of manufacturing a ferroelectric layer, the ferroelectric may include Nb in a range of "$0.1 \leq x \leq 0.3$".

In this method of manufacturing a ferroelectric layer, the ferroelectric may include Si or Si and Ge in an amount of 0.5 mol % or more. The crystallization temperature can be reduced by adding Si or Ge.

In this method of manufacturing a ferroelectric layer, the vapor phase method may be a metalorganic chemical vapor deposition (MOCVD) method.

According to one embodiment of the invention, there is provided a method of manufacturing an electronic instrument, comprising:

forming a first electrode layer above a base;

forming a first ferroelectric layer above the first electrode layer by a vapor phase method;

forming a second ferroelectric layer above the first ferroelectric layer by a liquid phase method; and forming a second electrode layer above the second ferroelectric layer.

In this method of manufacturing an electronic instrument, the vapor phase method may be a metalorganic chemical vapor deposition (MOCVD) method.

The embodiments of the invention will be described in detail below, with reference to the drawings.

1. Ferroelectric Layer

FIG. 1 is a cross-sectional view schematically showing a structure including a ferroelectric layer according to one embodiment of the invention. In this structure, a ferroelectric layer 20 is formed on an electrode layer 10 which forms at least part (uppermost layer) of a base (not shown). The ferroelectric layer 20 includes a first ferroelectric layer 22 formed on the electrode layer 10 and a second ferroelectric layer 24 formed on the first ferroelectric layer 22.

The electrode layer 10 is not particularly limited. At least the uppermost layer of the electrode layer 10 may be formed of a platinum metal such as Pt or Ir. A perovskite-type electrode material such as $SrRuO_3$ or $LaNiO_3$ may be used instead of the platinum metal.

The first ferroelectric layer 22 is a ferroelectric layer formed by an MOCVD method which is a vapor phase method. The second ferroelectric 24 is a ferroelectric layer formed by a liquid phase method.

The first ferroelectric layer 22 may function as a seed layer (or buffer layer) when the second ferroelectric layer 24 is epitaxially grown. Therefore, it suffices that the first ferroelectric layer 22 have such a thickness that the first ferroelectric layer 22 can function as a seed layer or a buffer layer. The first ferroelectric layer 22 may have a thickness of 10 nm, for example.

The second ferroelectric layer 24 is a ferroelectric layer formed by a sol-gel method, an MOD method, or a liquid phase method (chemical solution method) using a solution containing a specific precursor described later or the like. The second ferroelectric layer 24 forms the major portion of the ferroelectric layer 20. The thickness of the second ferroelectric layer 24 is selected depending on the application. For example, the second ferroelectric layer 24 may have a thickness of 1 micron.

A ferroelectric which forms the first ferroelectric layer 22 and the second ferroelectric layer 24 is not particularly limited insofar as the ferroelectric can be deposited by an MOCVD method (vapor phase method) and a liquid phase method. The composition of the ferroelectric which forms the first ferroelectric layer 22 may be the same as or different from the composition of the ferroelectric which forms the second ferroelectric layer 24.

The type of ferroelectric layer according to this embodiment is not particularly limited. The first ferroelectric layer 22 and the second ferroelectric layer 24 may include a ferroelectric shown by a general formula "$AB_{1-x}C_xO_3$".

In this case, the element A may include at least Pb, the element B may include at least one of Zr, Ti, V, W, and Hf, and the element C may include at least one of Nb and Ta.

In the ferroelectric layers 22 and 24 according to this embodiment, the element B may be Zr and Ti, and the element C may be Nb.

The base is not particularly limited and is selected depending on the application to which the ferroelectric layer is applied. As examples of the base, a base in which an insulating layer and an electrode layer are formed on a silicon substrate, a base in which a buffer layer is formed on a sapphire substrate, and the like can be given. These bases may include another layer, if necessary.

2. Method of Manufacturing Ferroelectric Layer

As shown in FIG. 1, the first ferroelectric layer 22 is formed on the electrode layer 10 by a known MOCVD method. The MOCVD method is generally carried out using an organometallic compound, a metal complex, a metal alkoxide, or the like as the raw material. The raw material is selected depending on the type of ferroelectric.

For example, when depositing $Pb(Zr,Ti)O_3$ (PZT), $Pb(Zr,Ti,Nb)O_3$ (PZTN), $(Pb,La)(Zr,Ti)O_3$ (PLZT), or $(Ba,Sr)TiO_3$ (BST) as the ferroelectric, the following raw materials may be used.

Pb: $Pb(C_2H_5)_4$, $Pb(DPM)_2$, $(C_2H_5)_3PbOCH_2C(CH_3)_3$, $Pb(C_2H_5)_3(t\text{-}OC_4H_9)$ Zr: $Zr(t\text{-}OC_4H_9)_4$, $Zr(DPM)_4$ Ti: $Ti(i\text{-}OC_3H_7)_4$, $Ti(DPM)_2(i\text{-}OC_3H_7)_2$, $Ti(OC_2H_5)_4$ La: $La(DPM)_3$ Ba: $Ba(DPM)_2$ Sr: $Sr(DPM)_2$, $Sr(DPM)_2\text{-trien}_2$, $Sr(DPM)_2\text{-tetraen}_2$ Ti: $Ti(i\text{-}OC_3H_7)_4$, $TiO(DPM)_2$, $Ti(i\text{-}OC_3H_7)_2(DPM)_2$ Nb: $Nb(DPM)_4$ Note that "DPM" represents dipivaloylmethanato $(C_{11}H_{19}O_2)$.

As shown in FIG. 1, the second ferroelectric layer 24 is formed on the first ferroelectric layer 22 by a liquid phase method. As the liquid phase method, a known sol-gel method or MOD method may be used. In this embodiment, a liquid phase method using a precursor composition described below may be preferably used.

The second ferroelectric layer 24 is formed using a precursor composition including a precursor, and the precursor includes at least the element B and the element C and has an ester bond.

2.1 Precursor Composition

A precursor composition according to this embodiment is used to deposit a ferroelectric. The ferroelectric may be shown by a general formula "$AB_{1-x}C_xO_3$", for example. The element A may include at least Pb, the element B may include at least one of Zr, Ti, V, W, and Hf, and the element C may include at least one of Nb and Ta. In this embodiment, the precursor includes at least the element B and the element C and includes an ester bond.

In the precursor composition according to this embodiment, the precursor may be dissolved or dispersed in an organic solvent. An alcohol may be used as the organic solvent. The alcohol is not particularly limited. As examples of the alcohol, monohydric alcohols such as butanol, methanol, ethanol, and propanol, and polyhydric alcohols can be given. Specific examples of the alcohol are given below.

Monohydric Alcohol:

Propanol (propyl alcohol): 1-propanol (boiling point: 97.4° C.) and 2-propanol (boiling point: 82.7° C.)

Butanol (butyl alcohol): 1-butanol (boiling point: 117° C.), 2-butanol (boiling point: 100° C.), 2-methyl-1-propanol (boiling point: 108° C.), and 2-methyl-2-propanol (melting point: 25.4° C., boiling point: 83° C.)

Pentanol (amyl alcohol): 1-pentanol (boiling point: 137° C.), 3-methyl-1-butanol (boiling point: 131° C.), 2-methyl-1-butanol (boiling point: 128° C.), 2,2-dimethyl-1-propanol (boiling point: 113° C.), 2-pentanol (boiling point: 119° C.), 3-methyl-2-butanol (boiling point: 112.5° C.), 3-pentanol (boiling point: 117° C.), and 2-methyl-2-butanol (boiling point: 102° C.)

Polyhydric Alcohol:

Ethylene glycol (melting point: −11.5° C., boiling point: 197.5° C.) and glycerol (melting point: 17° C., boiling point: 290° C.)

A ferroelectric obtained using the precursor composition according to this embodiment may include Nb in the range of preferably $0.05 \leq x < 1$, and still more preferably $0.1 \leq x \leq 0.3$. The ferroelectric may include Si or Si and Ge in an amount of preferably 0.5 mol % or more, and still more preferably 0.5 to 5 mol %. The element B may be Zr and Ti. Specifically, the ferroelectric according to this embodiment may be $Pb(Zr,Ti,Nb)O_3$ (PZTN) in which the Ti site is doped with Nb.

Nb has a size almost equal to the size of Ti (i.e. Nb and Ti have similar ionic radii and have the same atomic radius) and has an atomic weight twice the atomic weight of Ti. Therefore, Nb is not easily released from a lattice even if a collision occurs between atoms due to lattice vibration. Since Nb is stable at a valence of +5, the valence of Pb can be compensated for by $Nb^{5+}$ even if Pb is released. Moreover, even if Pb is released during crystallization, it is easier for small Nb to enter the lattice than large O to be released.

Since $Nb^{4+}$ also exists, Nb can replace $Ti^{4+}$. Moreover, since Nb has very strong covalent bonding properties, Nb is not easily released (H. Miyazawa, E. Natori, S. Miyashita; Jpn. J. Appl. Phys. 39 (2000) 5679).

Since the ferroelectric (particularly PZTN) obtained using the precursor composition according to this embodiment includes a specific amount of Nb, the ferroelectric exhibits excellent composition controllability due to the absence of an adverse effect caused by Pb deficiency. As a result, the PZTN exhibits excellent hysteresis characteristics, leakage characteristics, reduction resistance, and insulating properties in comparison with PZT, as is clear from the examples described later.

Nb has been doped into PZT mainly in the Zr-rich rhombohedral region. However, the amount of doping is as small as about 0.2 to 0.025 mol % (J. Am. Ceram. Soc, 84 (2001) 902; Phys. Rev. Let, 83 (1999) 1347). This is because the crystallization temperature is increased by adding a large amount of Nb (e.g. 800° C. or more when adding Nb in an amount of 10 mol %).

Figure 2:
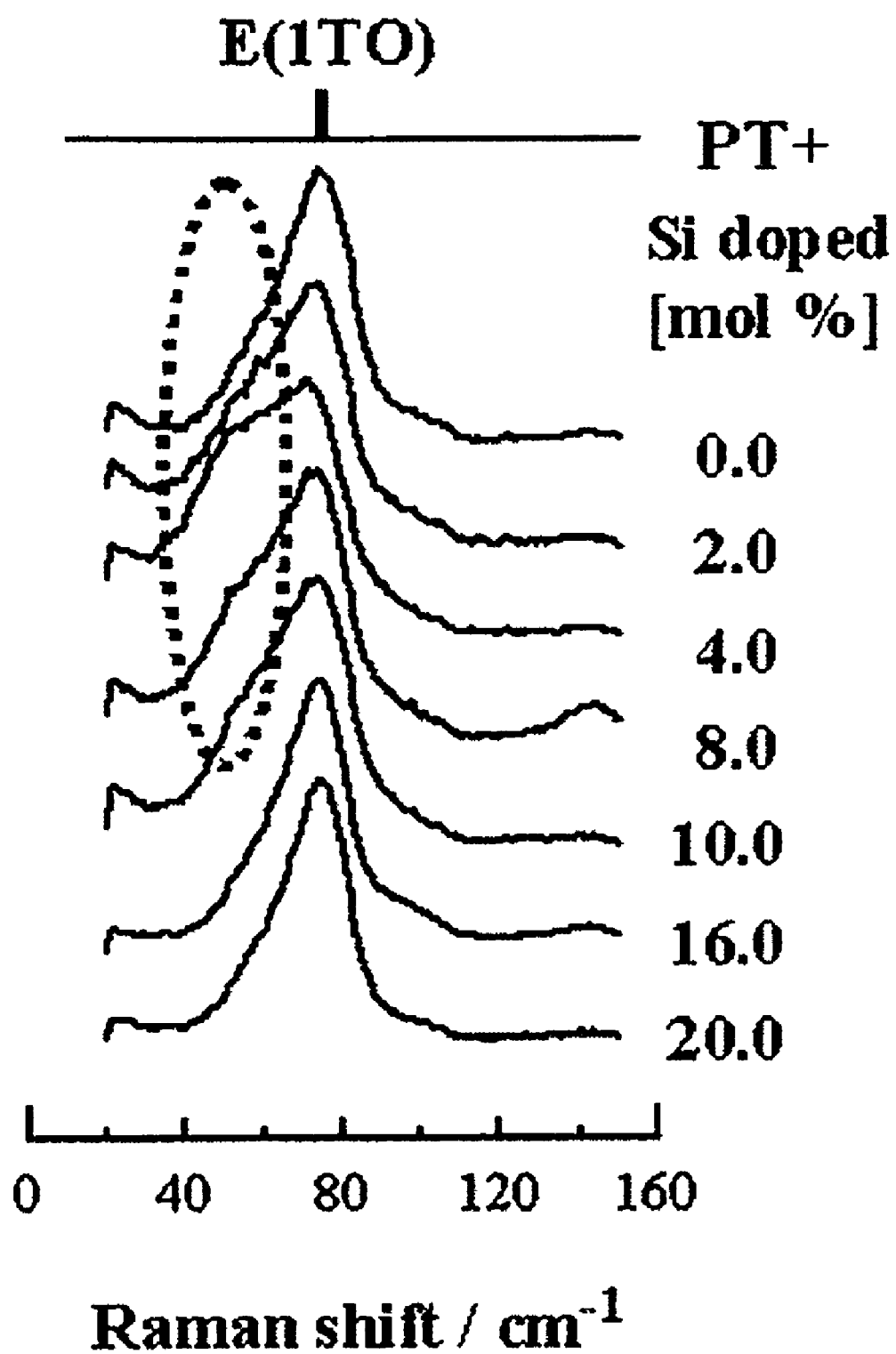
FIG. 2 shows a change in Raman vibration mode of an A-site ion when adding Si to lead titanate in one embodiment of the invention.

Therefore, it is preferable to add $PbSiO_3$ (silicate) to the ferroelectric precursor composition in an amount of 0.5 to 5 mol %, for example. This reduces the crystallization energy of PZTN. Specifically, when using PZTN as the material for the ferroelectric layer, the crystallization temperature of PZTN can be reduced by adding $PbSiO_3$ (silicate) together with Nb. Note that a silicate and a germanate may be used in combination. The inventors of the invention have confirmed that Si functions as a sintering agent and then forms part of the crystal as the A-site ion (see FIG. 2). Specifically, as shown in FIG. 2, when adding Si to lead titanate, a change in the Raman vibration mode E (1TO) of the A-site ion was observed. The change in the Raman vibration mode was observed when the amount of Si added was 8 mol % or less. Therefore, it was confirmed that Si exists in the A-site of the perovskite when adding a small amount of Si.

In this embodiment, Ta may be used instead of Nb, or may be used together with Nb. Ta shows a tendency similar to that of Nb.

In the precursor composition according to this embodiment, since the precursor includes an ester bond formed by esterification of a polycarboxylic acid and a metal alkoxide to allow a reversible reaction, the polymerized precursor can be decomposed into the metal alkoxide, as described later in detail. Therefore, the metal alkoxide can be recycled as the precursor raw material.

Moreover, this embodiment has the following advantages. Specifically, a commercially available PZT sol-gel solution generally contains lead acetate as the lead raw material. However, since lead acetate is bonded to an alkoxide of Ti or Zr to only a small extent, lead is not easily incorporated into the precursor network. According to this embodiment, a first carboxyl group, which is one of two carboxyl groups of succinic acid (dicarboxylic acid) initially functioning as an acid, has a pH of 4.0, which is lower than that of acetic acid (pH=4.56) (i.e. stronger than acetic acid). Therefore, lead acetate is bonded to succinic acid. Specifically, a reaction shown by "salt of weak acid+strong acid? salt of strong acid+ weak acid" occurs. Moreover, since the remaining second carboxyl group of succinic acid is bonded to another MOD molecule or alkoxide, Pb can be easily incorporated into the precursor network.

2.2 Method of Producing Precursor Composition

The above precursor composition may be used to form a ferroelectric shown by a general formula "$AB_{1-x}C_xO_3$", wherein the element A includes at least Pb, the element B includes at least one of Zr, Ti, V, W, and Hf, and the element C includes at least one of Nb and Ta.

A method of producing the precursor composition includes mixing a sol-gel raw material including at least the element B and the element C and including a hydrolysis-condensation product of a metal alkoxide, a polycarboxylic acid or a polycarboxylic acid ester, and an organic solvent, and forming a precursor including an ester bond formed by esterification of the polycarboxylic acid or a polycarboxylic acid derived from the polycarboxylic acid ester and the metal alkoxide.

This precursor composition is useful when manufacturing a ferroelectric in which the element B includes Zr and Ti and the element C includes Nb or Ta.

Figure 5:
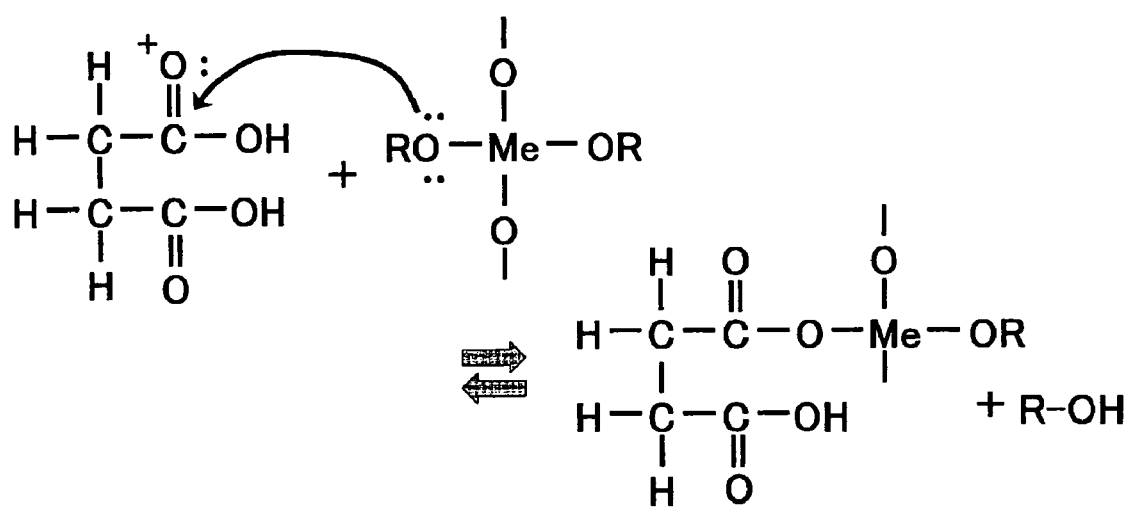
FIG. 5 shows a formation reaction of a precursor in a precursor composition according to one embodiment of the invention.
Figure 6:
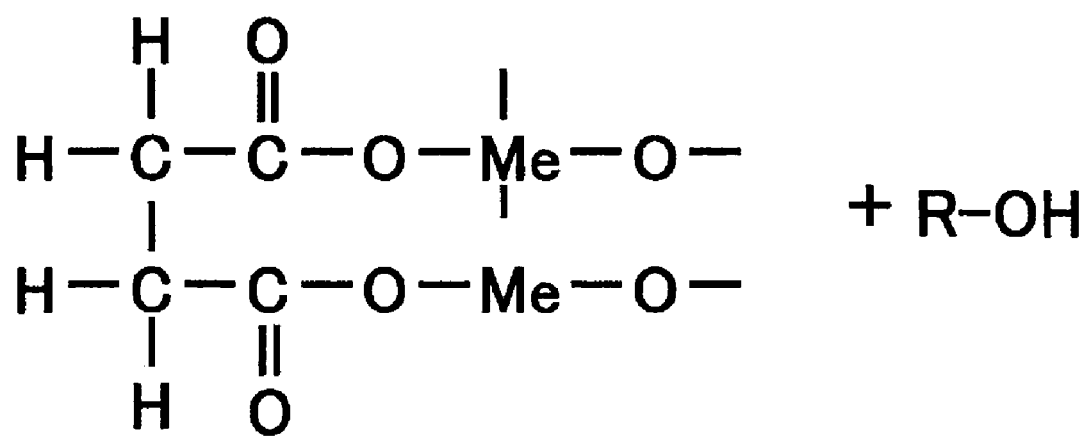
FIG. 6 shows a formation reaction of a precursor in a precursor composition according to one embodiment of the invention.

FIGS. 5 and 6 schematically show a precursor formation reaction in the production method according to this embodiment.

The precursor formation reaction is roughly divided into a first-stage alkoxyl group substitution reaction as shown in FIG. 5, and a second-stage polymer network formation reaction by esterification as shown in FIG. 6. FIGS. 5 and 6 illustrate an example when using dimethyl succinate as the polycarboxylic acid ester and n-butanol as the organic solvent. Nonpolar dimethyl succinate dissociates in an alcohol to produce a dicarboxylic acid.

In the first-stage reaction, dimethyl succinate and the metal alkoxide of the sol-gel raw material undergo esterification and are bonded through an ester bond, as shown in FIG. 5. Specifically, dimethyl succinate dissociates in n-butanol so that one of the carbonyl groups (first carbonyl group) is protonated. A substitution reaction occurs between the first carbonyl group and the alkoxyl group of the metal alkoxide to produce a reaction product, in which the first carboxyl group is esterified, together with an alcohol. The term "ester bond" used herein means a bond (—COO—) formed by a carbonyl group and an oxygen atom.

In the second-stage reaction, a substitution reaction occurs between the remaining carboxyl group (second carboxyl group) and the alkoxyl group of the metal alkoxide to produce a reaction product, in which the second carboxyl group is esterified, together with an alcohol, as shown in FIG. 6.

A polymer network, in which the hydrolysis-condensation products of the metal alkoxide included in the sol-gel raw material are bonded through ester bonds, is obtained by the above two-stage reaction. Therefore, the polymer network includes a moderate amount of ester bond in the network. Since dimethyl succinate dissociates in two stages and the first carboxyl group has an acid dissociation constant greater than that of the second carboxyl group, the first-stage reaction has a rate of reaction higher than the rate of reaction of the second-stage reaction. Therefore, the second-stage reaction proceeds more slowly than the first-stage reaction.

In this embodiment, the following method may be used to promote the above-described esterification reaction.

(a) The concentration or reactivity of the reaction product may be increased. In more detail, the reactivity is increased by increasing the degree of dissociation of the polycarboxylic acid or the polycarboxylic acid ester by increasing the temperature of the reaction system. It is preferable that the temperature of the reaction system be higher than room temperature and lower than the boiling point of the organic solvent and the like, although the temperature of the reaction system varies depending on the boiling point of the organic solvent. The temperature of the reaction system may be 100° C. or less, and preferably 50 to 100° C., for example.

(b) A reaction by-product may be removed. In more detail, esterification is promoted by removing water and an alcohol produced during esterification.

(c) The molecular motion of the reaction product may be physically accelerated. In more detail, the reactivity of the reaction product is increased by applying energy rays such as ultraviolet rays.

The organic solvent used in the method of producing the precursor composition according to this embodiment may be an alcohol. The sol-gel raw material and the polycarboxylic acid or the polycarboxylic acid ester can be efficiently dissolved by using an alcohol as the solvent.

The polycarboxylic acid or the polycarboxylic acid ester used in the method of producing the precursor composition according to this embodiment is not particularly limited. The polycarboxylic acid or the polycarboxylic acid ester may be a carboxylic acid or a carboxylic acid ester having two or more carboxyl groups. As examples of the polycarboxylic acid used in this embodiment, the following compounds can be given. As examples of the tricarboxylic acid, trans-aconitic acid, trimesic acid, and the like can be given. As examples of the tetracarboxylic acid, pyromellitic acid, 1,2,3,4-cyclopentanetetracarboxylic acid, and the like can be given. As examples of the polycarboxylic acid ester which dissociates in an alcohol to function as a polycarboxylic acid, dicarboxylic acid esters such as dimethyl succinate, diethyl succinate, dibutyl oxalate, dimethyl malonate, dimethyl adipate, dimethyl maleate, and diethyl fumarate, tricarboxylic acid esters such as tributyl citrate and triethyl 1,1,2-ethanetricarboxylate, tetracarboxylic acid esters such as tetraethyl 1,1,2,2-ethanetetracarboxylate and trimethyl 1,2,4-benzenetricarboxylate, and the like can be given. The above polycarboxylic acid ester dissociates in the presence of an alcohol to function as a polycarboxylic acid. FIGS. 4A to 4D illustrate the above-mentioned polycarboxylic acids and polycarboxylic acid esters. A feature of this embodiment is that the network is grown by esterification using the polycarboxylic acid. Since an ester network is not grown when using a monocarboxylic acid or a monocarboxylic acid ester, such as acetic acid or methyl acetate, a monocarboxylic acid or a monocarboxylic acid ester is not used in this embodiment.

In the method of producing the precursor composition, the dicarboxylic acid ester is preferably at least one compound selected from a succinic acid ester, a maleic acid ester, and a malonic acid ester. As specific examples of these esters, dimethyl succinate, dimethyl maleate, and dimethyl malonate can be given.

The polycarboxylic acid ester may have a molecular weight of 150 or less. If the molecular weight of the polycarboxylic acid ester is too high, the resulting film may be damaged when the ester volatilizes during heat treatment, whereby a dense film may not be obtained.

The polycarboxylic acid ester may be liquid at room temperature. If the polycarboxylic acid ester is solid at room temperature, gelation may occur.

Figure 3:
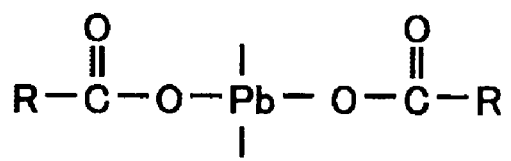
FIG. 3 shows lead-containing carboxylic acids used in one embodiment of the invention.
Figure 3:
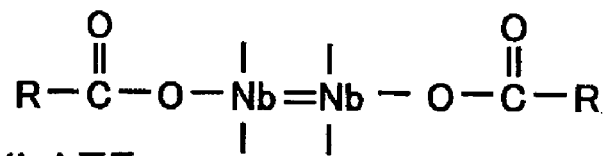
Figure 3:
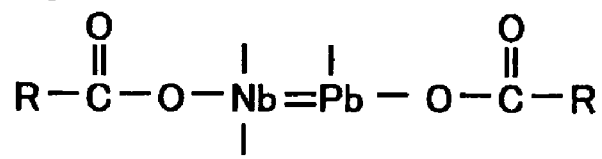
Figure 4A:
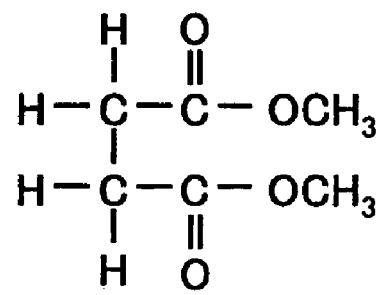
FIGS. 4A to 4D show polycarboxylic acids or polycarboxylic acid esters used in one embodiment of the invention.
Figure 4A:
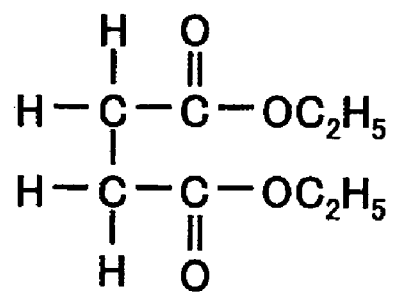
Figure 4B:
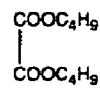
Figure 4B:
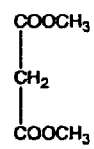
Figure 4B:
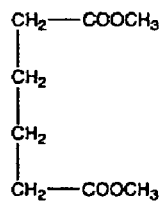
Figure 4B:
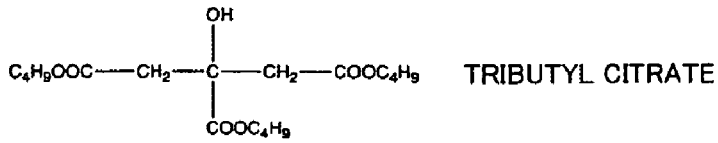
Figure 4B:
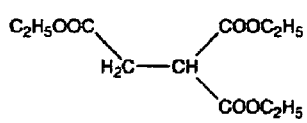
Figure 4B:
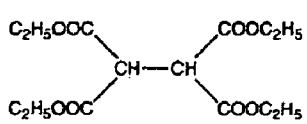
Figure 4C:
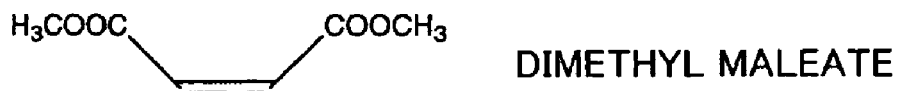
Figure 4C:
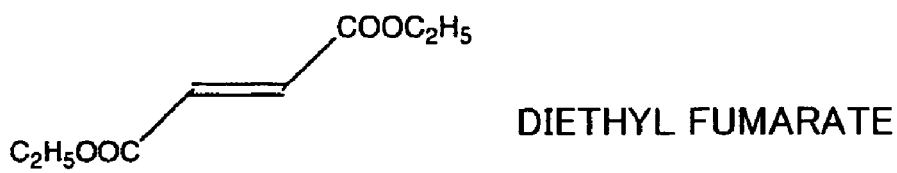
Figure 4C:
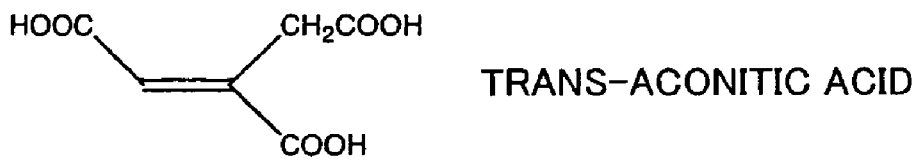
Figure 4D:
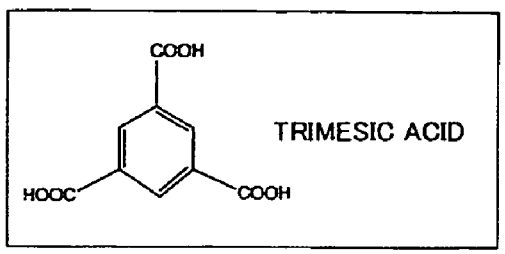
Figure 4D:
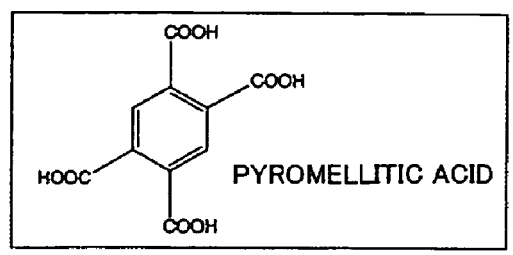
Figure 4D:
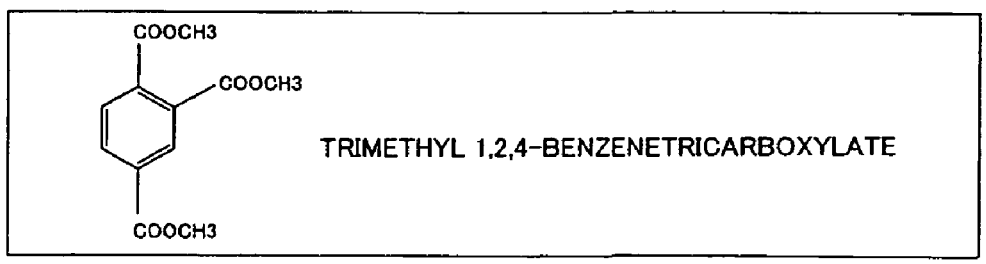
Figure 4D:
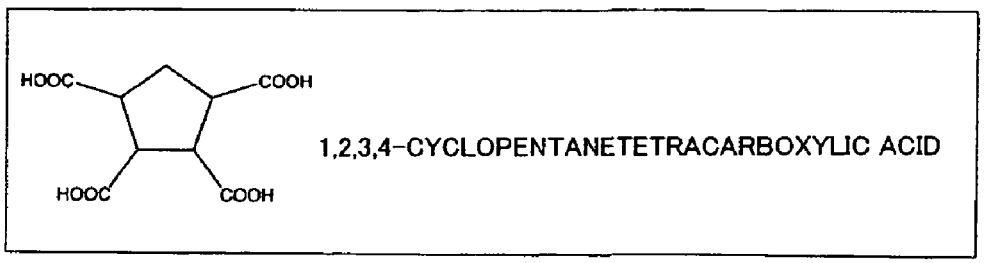

In the method of producing the precursor composition, a sol-gel raw material including a metal carboxylate may be mixed with the above sol-gel raw material, the polycarboxylic acid or the polycarboxylic acid ester, and the organic solvent. As examples of the metal carboxylate, lead carboxylate such as lead acetate can be given. Further examples include lead octylate, niobium octylate, and niobium lead octylate as shown in FIG. 3.

In the method of producing the precursor composition, an organometallic compound (MOD raw material) may be mixed together with the sol-gel raw material, the polycarboxylic acid or the polycarboxylic acid ester, and the organic solvent. According to the method of producing the precursor composition of this embodiment, not only the alkoxide raw materials, but also the MOD raw material and the alkoxide raw material may be bonded through ester bonds.

The formation of the network of the carboxylic acid and the MOD raw material mainly proceeds through an alcohol exchange reaction. When using niobium octylate, a reaction occurs between the carboxylic acid and an octyl group (alcohol exchange reaction), whereby esterification (R—COO—Nb) proceeds. As described above, according to this embodiment, the molecules of the MOD raw material can be bonded to the precursor network through condensation between the MOD raw material and the alkoxide by esterifying the MOD raw material.

In the method of producing the precursor composition, a sol-gel raw material including Si or Si and Ge may be used as the sol-gel raw material including a hydrolysis-condensation product of the metal alkoxide.

In the method of producing the precursor composition, PZTN may be obtained by using a solution prepared by mixing at least a $PbZrO_3$ sol-gel solution, a $PbTiO_3$ sol-gel solution, and a $PbNbO_3$ sol-gel solution as the above sol-gel solution. For example, the $PbNbO_3$ sol-gel solution is prepared by mixing lead octylate and niobium octylate. The state shown in FIG. 3 is obtained by the alcohol exchange reaction between lead octylate and niobium octylate. A $PbTaO_3$ sol-gel solution may be used instead of the $PbNbO_3$ sol-gel solution.

Figure 7:
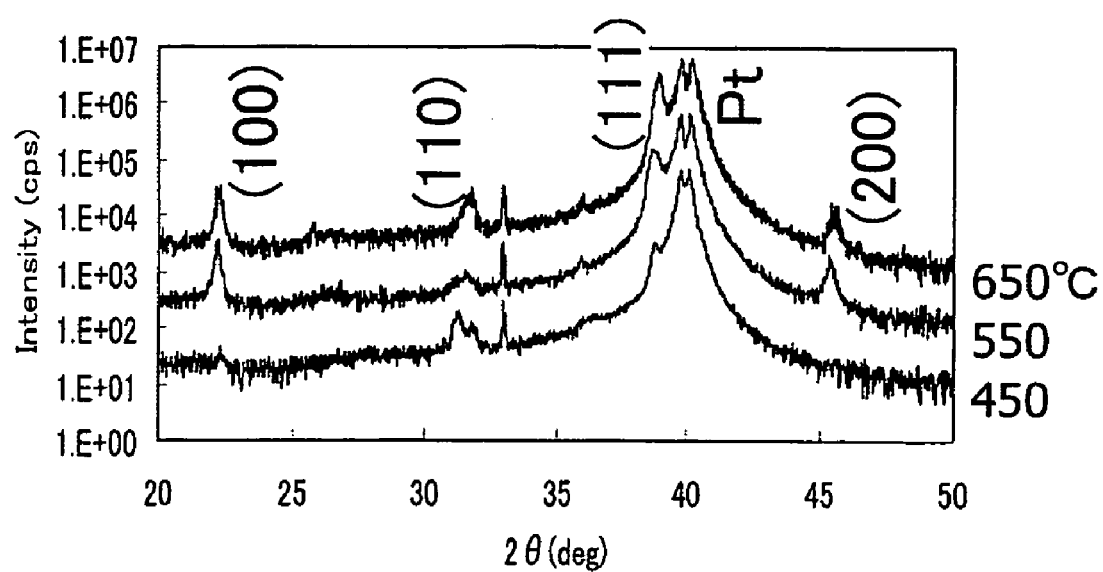
FIG. 7 shows crystallinity when using a sol-gel raw material including Si and Ge according to one embodiment of the present invention.

In the method of producing the precursor composition according to this embodiment, a sol-gel raw material including Si or Si and Ge may be used as the sol-gel raw material including the hydrolysis-condensation product of the metal alkoxide. As such a sol-gel solution, a $PbSiO_3$ sol-gel solution or a combination of a $PbSiO_3$ sol-gel solution and a $PbGeO_3$ sol-gel solution may be used. The deposition temperature can be reduced by using the sol-gel raw material including Si or Ge, whereby a ferroelectric can be crystallized at a temperature as low as about 450° C. Specifically, as shown in FIG. 7, a peak indicating the PZTN ferroelectric according to this embodiment is observed at a crystallization temperature of 450° C.

The amount of polycarboxylic acid or polycarboxylic acid ester used is selected depending on the composition ratio of the sol-gel raw material and the ferroelectric. The ratio of the total molar ion concentration of the PZT sol-gel raw material, PbNb sol-gel raw material, and PbSi sol-gel raw material, to which the polycarboxylic acid is bonded, to the molar ion concentration of the polycarboxylic acid is set at preferably "1≦(molar ion concentration of polycarboxylic acid)/(total molar ion concentration of raw material solution)", and still more preferably 1:1. The polycarboxylic acid may be added in an amount of 0.35 mol, for example.

It is preferable that the amount of polycarboxylic acid or polycarboxylic acid ester added be equal to or greater than the total number of moles of the raw material solution. All the raw materials bond when the molar ion concentration ratio is 1:1. However, since an ester stably exists in an acidic solution, it is preferable to add the polycarboxylic acid in excess to the total number of moles of the raw material solution in order to allow an ester to stably exist. The number of moles of the polycarboxylic acid or the polycarboxylic acid ester used herein refers to the number of carboxyl groups. Specifically, when using a dicarboxylic acid or a dicarboxylic acid ester, one dicarboxylic acid or dicarboxylic acid ester molecule can be bonded to two raw material molecules. Therefore, the ratio is 1:1 when the amount of dicarboxylic acid or dicarboxylic acid ester is 0.5 mol for one mol of the raw material solution. The polycarboxylic acid ester does not initially function as an acid. The polycarboxylic acid ester produces a polycarboxylic acid when caused to dissociate in an alcohol. In this case, it is preferable that the number of moles of alcohol added be "1≦(number of moles of alcohol/number of moles of polycarboxylic acid ester)". This is because the polycarboxylic acid ester more sufficiently and stably dissociates as the number of moles of alcohol is greater. The number of moles of alcohol used herein refers to a molar ion concentration obtained by dividing the number of moles by the number of hydroxyl groups.

Since the precursor of the precursor composition includes a moderate amount of ester bond between the molecular networks, a reversible reaction can occur. Therefore, the polymerized precursor (polymer network) can be decomposed into the metal alkoxide condensate by causing the reaction shown in FIG. 5 to occur in the left direction.

The manufacturing method using the precursor composition according to this embodiment has the following features.

According to this manufacturing method, a polymer network in which the hydrolysis-condensation products (molecular networks) of the metal alkoxide of the sol-gel raw material are bonded through ester bonds is obtained in the organic solvent by using the polycarboxylic acid. Therefore, the polymer network includes a moderate amount of ester bond between the molecular networks derived from the hydrolysis-condensation products. The esterification reaction can be easily carried out by controlling the temperature or the like.

Since the precursor composition according to this embodiment includes a moderate amount of ester bond between the molecular networks, a reversible reaction can occur. Therefore, the polymerized precursor (polymer network) can be decomposed into the metal alkoxide (or molecular network of the condensation product) in the composition remaining after depositing the ferroelectric layer. Since the metal alkoxide (or molecular network of the condensation product) can be recycled as the precursor raw material, a toxic substance such as lead can be recycled. Therefore, it is advantageous from the viewpoint of the environment.

In this embodiment, the above-described precursor composition is applied to the first ferroelectric layer 22 and heated to form the second ferroelectric layer 24. The coating method is not particularly limited. A known method such as a spin coating method or an inkjet coating method may be used. After forming the ferroelectric layer 20 including the first ferroelectric layer 22 and the second ferroelectric layer 24 on the electrode layer 10, another electrode layer (not shown) is formed by sputtering or the like to obtain a capacitor.

The manufacturing method according to this embodiment has the following features.

According to this embodiment, the first ferroelectric layer 22 is formed on the electrode layer 10 using a platinum metal or the like by the MOCVD method (vapor phase method), and the second ferroelectric layer 24 is formed on the first ferroelectric layer 22 by the liquid phase method, whereby the ferroelectric layer 20 exhibiting excellent crystallinity can be formed. Since the first ferroelectric layer 22 is formed by the MOCVD method, the first ferroelectric layer 22 exhibits excellent crystallinity even if the electrode layer 10 exhibits poor crystallinity and flatness. The first ferroelectric layer 22 functions as a seed layer (or buffer layer) when forming the second ferroelectric layer 24 on the first ferroelectric layer 22 by the liquid phase method, whereby the second ferroelectric layer 24 is epitaxially grown to exhibit excellent orientation.

Therefore, the manufacturing method according to this embodiment is particularly useful when using an underlayer on which it is difficult to form an excellent ferroelectric layer. For example, when forming a stacked ferroelectric capacitor, a lower electrode layer is provided with a multilayer structure in order to prevent expansion of a tungsten plug connected with the lower electrode layer due to oxidation. The lower electrode layer is formed by forming an amorphous conductive material layer (e.g. nitride film such as TiN or TiAlN) over the tungsten plug, forming an Ir or $IrO_X$ (amorphous) layer on the amorphous conductive material layer in order to prevent fatigue of the ferroelectric layer, and forming a Pt layer in the uppermost layer, for example. Specifically, since the lower electrode layer of the stacked ferroelectric capacitor has a structure in which the metal layer and the metal oxide layer having different properties are stacked under the Pt layer, the Pt layer exhibits poor flatness and crystallinity.

However, the ferroelectric layer 20 exhibiting excellent crystallinity, which cannot be obtained when using only the liquid phase method, can be formed by applying the manufacturing method according to this embodiment when forming the ferroelectric layer of the stacked ferroelectric capacitor. The manufacturing method according to this embodiment also has the same features when using a base which does not have a complicated structure differing from the stacked ferroelectric capacitor.

3. Example

An example according to the invention is described below.

3.1. Reference Example 1

A difference in the ferroelectric layer due to the structure of a base (electrode layer) on which the ferroelectric layer is formed was examined.

Figure 8:
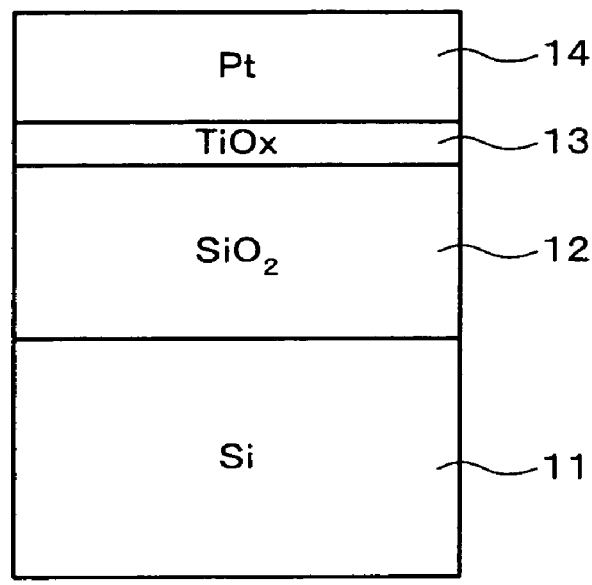
FIG. 8 is a cross-sectional view showing a first base sample including a Pt layer.
Figure 9:
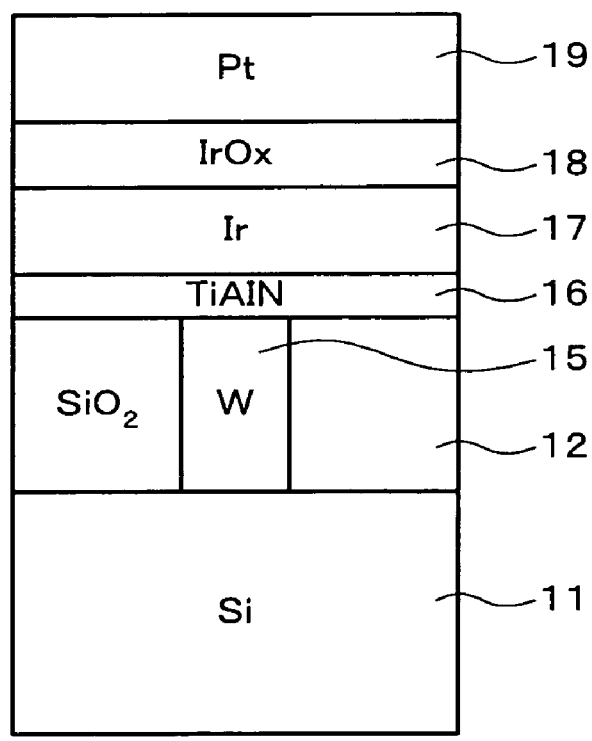
FIG. 9 is a cross-sectional view showing a second base sample including a Pt layer.

FIG. 8 shows the structure of a base (first base sample) having a planar platinum electrode layer, and FIG. 9 shows the structure of a base (second base sample) having a lower electrode layer (stacked electrode layer) of a stacked ferroelectric capacitor.

The first base sample has a structure in which an $SiO_2$ layer (interlayer dielectric) 12 as an insulating layer, a $TiO_X$ layer 13, and a Pt layer 14 are stacked on a silicon substrate 11. In the second base sample, the $SiO_2$ layer (interlayer dielectric) 12 is formed on the silicon substrate 11, and a tungsten plug 15 is formed in the $SiO_2$ layer 12. In this case, after forming the $SiO_2$ layer (interlayer dielectric) 12 on the silicon substrate 11, a hole is formed in the $SiO_2$ layer (interlayer dielectric) 12, and the tungsten plug 15 (electrode layer) is formed in the hole. An amorphous TiAlN layer 16, an amorphous Ir layer 17, an amorphous $IrO_X$ layer 18, and a Pt layer 19 are formed on the tungsten plug 15 and the $SiO_2$ layer 12.

Figure 10:
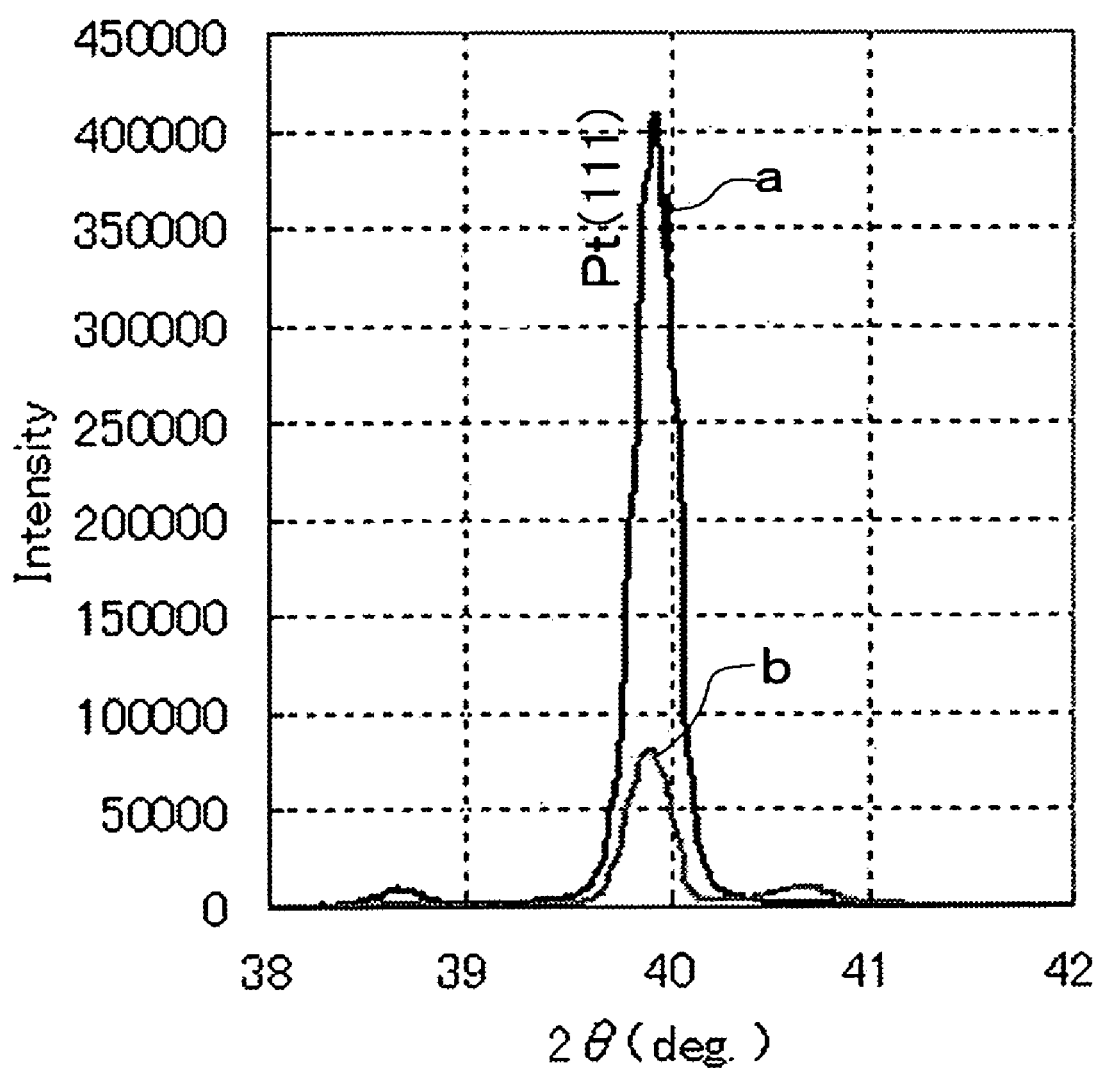
FIG. 10 shows X-ray analysis results of the Pt layers of the first base sample and the second base sample.

FIG. 10 shows the X-ray diffraction patterns of the first and second base samples. In FIG. 10, the peak indicated by the symbol "a" indicates the peak of the first base sample, and the peak indicated by the symbol "b" indicates the peak of the second base sample. As shown in FIG. 10, the planar electrode layer showed clear Pt(111) orientation, and the stacked electrode layer showed Pt(111) orientation significantly weaker than that of the planar electrode layer and showed a small peak.

Therefore, it was found that the orientation of the electrode layer differs to a large extent depending on the stack structure even if the platinum layer is used in the uppermost layer of the electrode layer.

Then, a ferroelectric layer was formed on the first base sample and the second base sample, and the orientation of the ferroelectric layer was examined.

Specifically, a PZTN layer was formed on each of the Pt layers 4 and 9 (see FIGS. 8 and 9) of the first base sample and the second base sample by the following method.

The PZTN layer was obtained by mixing first to third raw material solutions, each containing at least one of Pb, Zr, Ti, and Nb, dimethyl succinate as the polycarboxylic acid ester, and n-butanol as the organic solvent, and crystallizing an oxide contained in the mixed solution by a heat treatment or the like. The mixed solution was prepared by dissolving the sol-gel raw material and dimethyl succinate in n-butanol at a ratio of 1:1.

As the first raw material solution, a solution was used in which a polycondensation product for forming a $PbZrO_3$ perovskite crystal formed by Pb and Zr as the constituent metal elements of a PZTN ferroelectric phase was dissolved in n-butanol in an anhydrous state.

As the second raw material solution, a solution was used in which a polycondensation product for forming a $PbTiO_3$ perovskite crystal formed by Pb and Ti, as the constituent metal elements of a PZTN ferroelectric phase was dissolved in n-butanol in an anhydrous state.

As the third raw material solution, a solution was used in which a polycondensation product for forming a $PbNbO_3$ perovskite crystal formed by Pb and Nb as the constituent metal elements of a PZTN ferroelectric phase was dissolved in n-butanol in an anhydrous state.

When forming a $PbZr_{0.2}Ti_{0.6}Nb_{0.2}O_3$ (PZTN) ferroelectric layer using the first, second, and third raw material solutions, the raw material solutions are mixed at a ratio of "(first raw material solution):(second raw material solution):(third raw material solution)=2:6:2", for example. In order to reduce the crystallization temperature of the ferroelectric layer, a solution prepared by dissolving a polycondensation product for forming a $PbSiO_3$ crystal in n-butanol in an anhydrous state was added as a fourth raw material solution in an amount of 3 mol %. Specifically, the crystallization temperature of PZTN can be reduced to 700° C. or less by using a mixed solution of the first, second, third, and fourth raw material solutions as the sol-gel raw material.

The PZTN layer was obtained by the following method using the above-described solutions.

The first to fourth raw material solutions and dimethyl succinate were dissolved in n-butanol at room temperature to prepare a solution (precursor composition). The resulting solution was applied to the first and second base samples by spin coating and dried at 150 to 180° C. (150° C.) using a hot plate to remove the alcohol. A cleaning heat treatment was then performed at 300 to 350° C. (300° C.) using a hot plate. Then, the coating step, the drying step, and the cleaning heat treatment step were optionally performed a number of times to obtain a coating film having a desired thickness. The coating film was then subjected to crystallization annealing (sintering) to obtain a PZTN layer sample having a thickness of 150 nm. The crystallization sintering was performed at 650 to 700° C. (700° C.) in an oxygen atmosphere by rapid thermal annealing (RTA).

Figure 11:
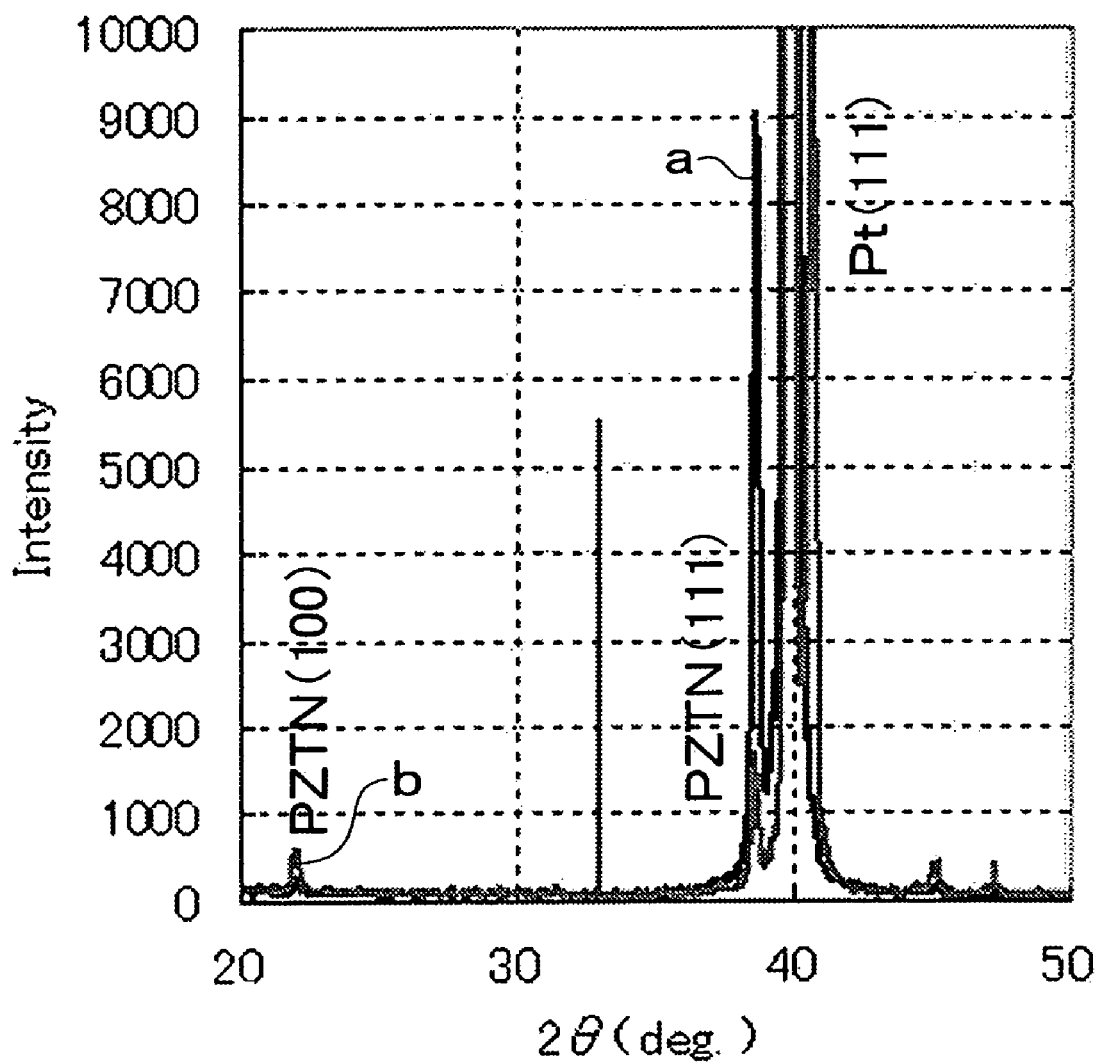
FIG. 11 shows X-ray analysis results of PZTN layers formed on the Pt layers of the first base sample and the second base sample.

The X-ray diffraction pattern of PZTN was measured for each sample to obtain results shown in FIG. 11. As shown in FIG. 11, it was confirmed that the PZTN layer formed on the first base sample (planar electrode layer) had (111) orientation as shown by the peak indicated by the symbol "a". On the other hand, it was confirmed that the PZTN layer formed on the second base sample (stacked electrode layer) had (100) orientation as shown by the peak indicated by the symbol "b".

From these results, it was confirmed that the orientation of the PZTN layer formed on the Pt layer differs depending on the structure of the base including the Pt layer.

3.2. Example 1

A PZT layer was formed on the second base sample of Reference Example 1 by the MOCVD method.

Figure 12:
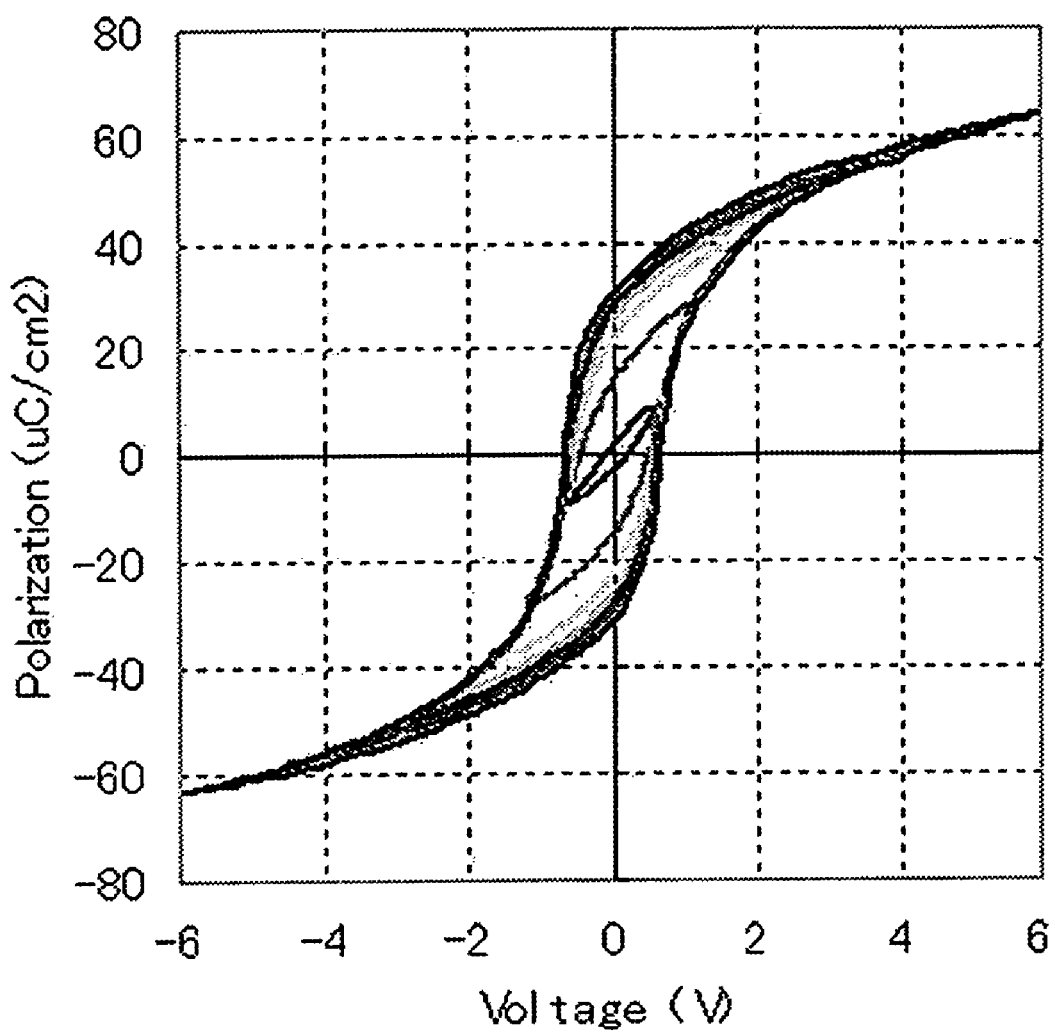
FIG. 12 shows hysteresis characteristics of a capacitor sample according to Example 1.

Then, a PZTN layer (second ferroelectric layer) was formed on the PZT layer by the method described in Reference Example 1. Then, a platinum upper electrode was formed on the PZTN layer by sputtering to obtain a ferroelectric capacitor sample (hereinafter called "capacitor sample"). The hysteresis characteristics of the capacitor sample were determined to obtain excellent results as shown in FIG. 12.

3.3. Comparative Example 1

Figure 13:
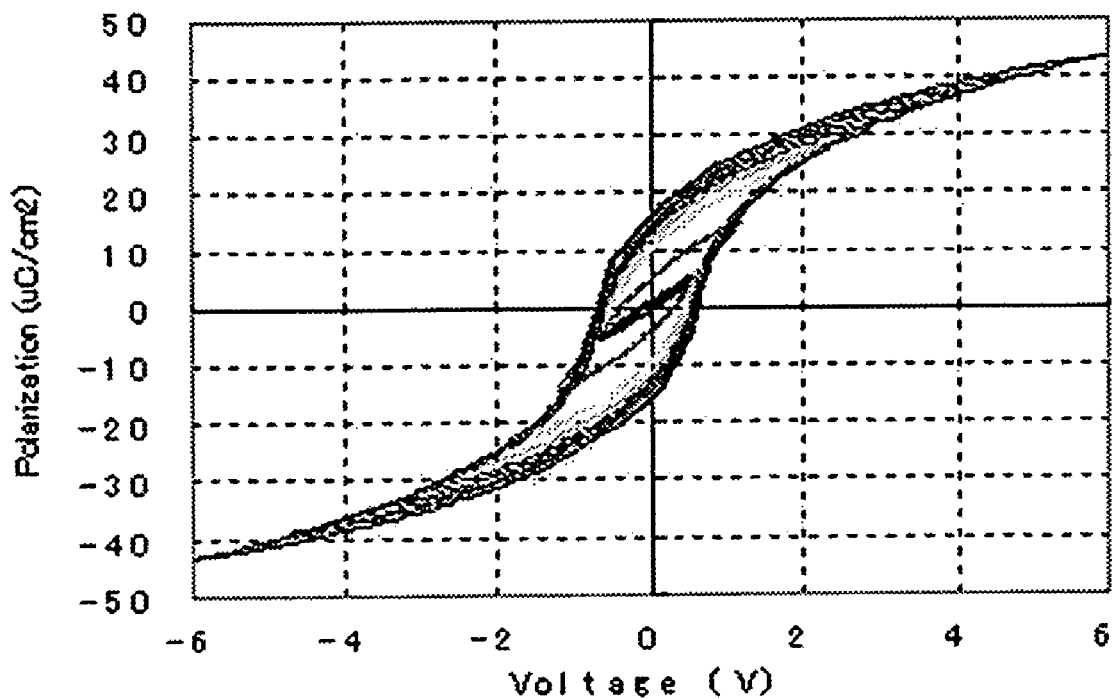
FIG. 13 shows hysteresis characteristics of a capacitor sample according to Comparative Example 1.

A capacitor sample was obtained in the same manner as in Example 1 except for omitting the formation of the PZT layer by the MOCVD method. The hysteresis characteristics of the sample were determined to obtain results shown in FIG. 13. As a result of comparison between the hysteresis characteristics shown in FIGS. 12 and 13, it was confirmed that the sample of Example 1 exhibited excellent squareness in comparison with the sample of Comparative Example 1.

4. Electronic Instrument

An electronic instrument including the ferroelectric layer according to the above embodiment is described below. The electronic instrument includes a ferroelectric memory device, a piezoelectric device, an inkjet recording head, and an inkjet printer described later. Note that the electronic instrument is not limited thereto.

4.1. Ferroelectric Memory Device

In this embodiment, a ferroelectric memory device including a ferroelectric capacitor which is an example of a semiconductor device is described below.

Figure 14A:
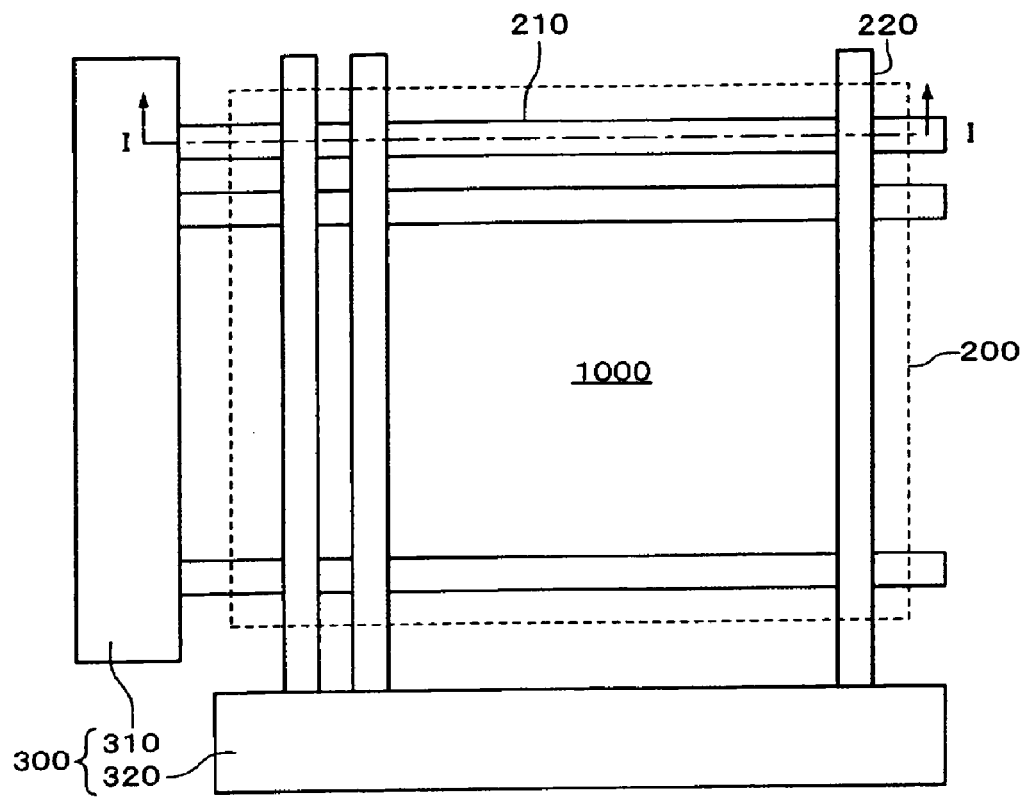
FIGS. 14A and 14B shows a semiconductor device according to one embodiment of the invention.
Figure 14B:
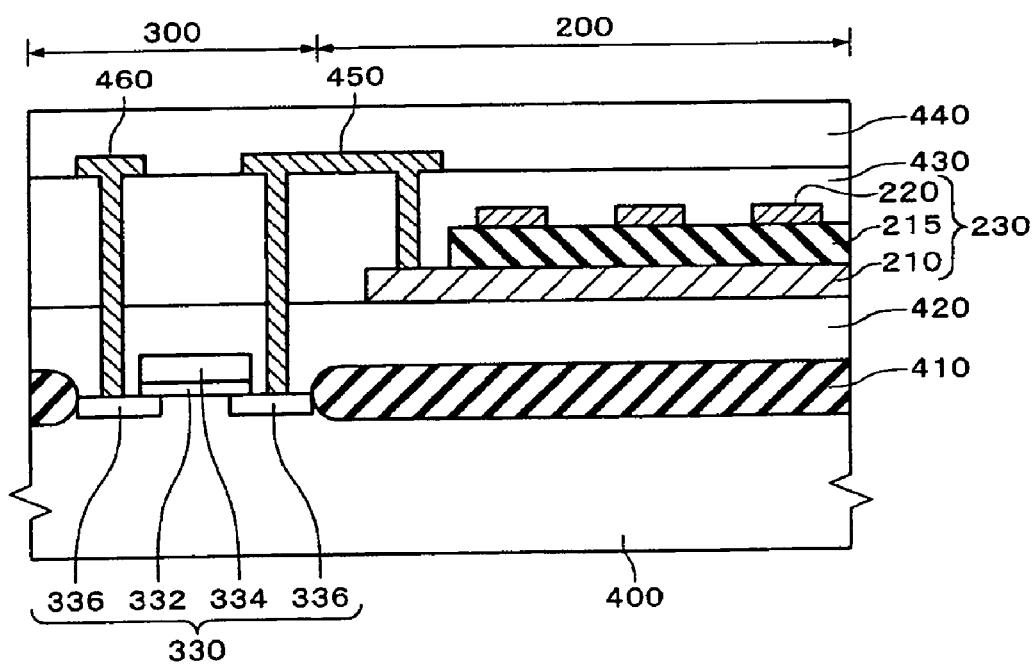

FIGS. 14A and 14B are views schematically showing a ferroelectric memory device 1000 using a ferroelectric capacitor obtained by the manufacturing method according to the above embodiment. FIG. 14A shows the planar shape of the ferroelectric memory device 1000, and FIG. 14B shows the cross section along the line I-I shown in FIG. 14A.

As shown in FIG. 14A, the ferroelectric memory device 1000 includes a memory cell array 200 and a peripheral circuit section 300. The memory cell array 200 and the peripheral circuit section 300 are formed in different layers. The peripheral circuit section 300 is disposed on a semiconductor substrate 400 in a region differing from the memory cell array 200. As specific examples of the peripheral circuit section 300, a Y gate, sense amplifier, input/output buffer, X address decoder, Y address decoder, or address buffer can be given.

In the memory cell array 200, row-selection lower electrodes 210 (wordlines) and column-selection upper electrodes 220 (bitlines) are arranged to intersect. The lower electrodes 210 and the upper electrodes 220 are formed in the shape of stripes formed by linear signal electrodes. The signal electrodes may be formed so that the lower electrode 210 functions as the bitline and the upper electrode 220 functions as the wordline.

As shown in FIG. 14B, a ferroelectric layer 215 is disposed between the lower electrode 210 and the upper electrode 220. In the memory cell array 200, a memory cell which functions as a ferroelectric capacitor 230 is formed in the intersecting region of the lower electrode 210 and the upper electrode 220. The ferroelectric layer 215 is a film formed using the raw material solution according to the above embodiment. It suffices that the ferroelectric layer 215 be disposed at least in the intersecting region of the lower electrode 210 and the upper electrode 220.

In the ferroelectric memory device 1000, a second interlayer dielectric 430 is formed to cover the lower electrode 210, the ferroelectric layer 215 according to the above embodiment, and the upper electrode 220. An insulating protective layer 440 is formed on the second interlayer dielectric 430 so that interconnect layers 450 and 460 are covered with the protective layer 440.

As shown in FIG. 14A, the peripheral circuit section 300 includes various circuits for selectively writing or reading information into or from the memory cell array 200. For example, the peripheral circuit section 300 includes a first driver circuit 310 for selectively controlling the lower electrode 210, a second driver circuit 320 for selectively controlling the upper electrode 220, and a signal detection circuit (not shown) such as a sense amplifier.

As shown in FIG. 14B, the peripheral circuit section 300 includes a MOS transistor 330 formed on the semiconductor substrate 400. The MOS transistor 330 includes a gate insulating film 332, a gate electrode 334, and source/drain regions 336. The MOS transistors 330 are isolated by an element isolation region 410. A first interlayer dielectric 420 is formed on the semiconductor substrate 400 on which the MOS transistor 330 is formed. The peripheral circuit section 300 is electrically connected with the memory cell array 200 through an interconnect layer 51.

In the ferroelectric memory device 1000, the ferroelectric capacitor 230 includes the ferroelectric layer 215 which can be crystallized at a low temperature. Therefore, the ferroelectric memory device 1000 can be manufactured without causing the MOS transistor 330 making up the peripheral circuit section 300 or the like to deteriorate. Since the ferroelectric capacitor 230 has excellent hysteresis characteristics, a highly reliable ferroelectric memory device 1000 can be provided.

Figure 15:
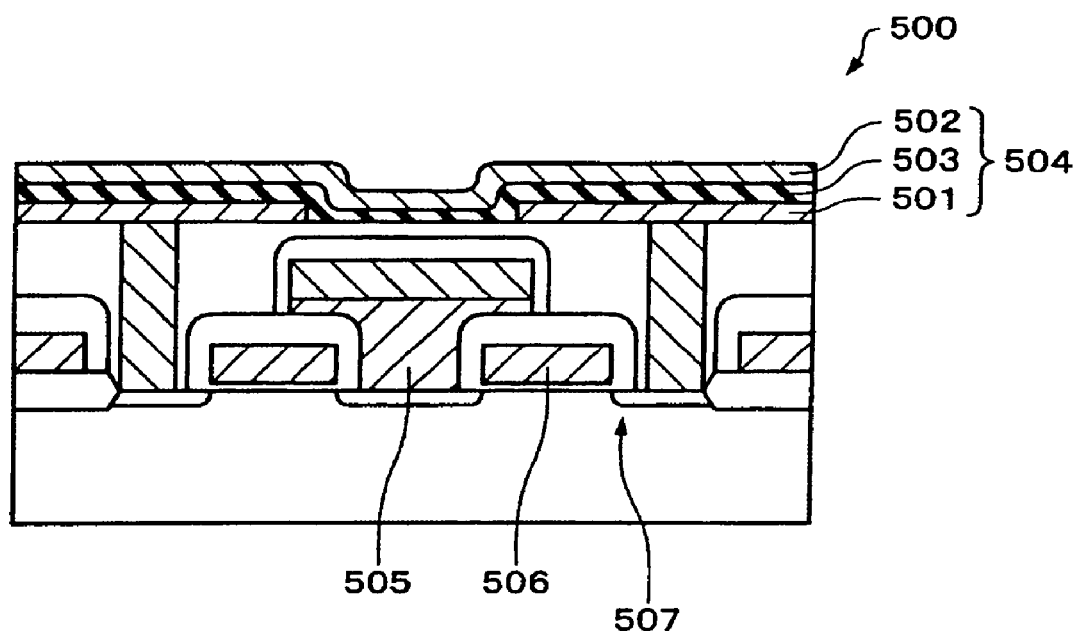
FIG. 15 is a cross-sectional view schematically showing a 1T1C ferroelectric memory according to one embodiment of the invention.
Figure 16:
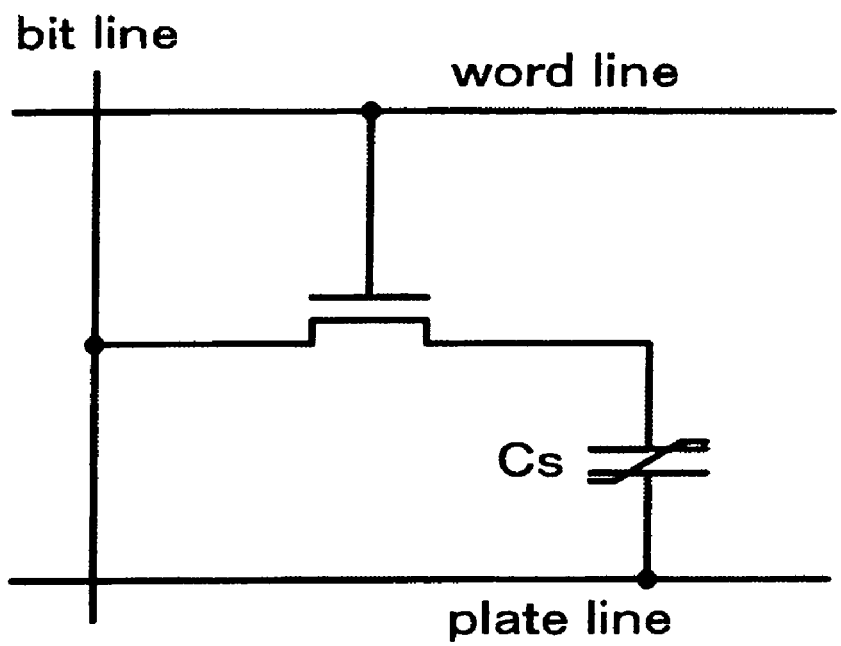
FIG. 16 is an equivalent circuit of the ferroelectric memory shown in FIG. 15.

FIG. 15 is a structural view of a 1T1C ferroelectric memory device 500 as another example of a semiconductor device. FIG. 16 is an equivalent circuit diagram of the ferroelectric memory device 500.

As shown in FIG. 15, the ferroelectric memory device 500 is a memory device having a structure similar to that of a DRAM, and includes a capacitor 504 (1C) including a lower electrode 501, an upper electrode 502 connected with a plate line, and a ferroelectric layer 503 according to the above embodiment, and a switch transistor device 507 (1T) in which one of source/drain electrodes is connected with a data line 505 and a gate electrode 506 is connected with a wordline. Since the 1T1C memory allows writing and reading at a speed as high as 100 ns or less and prevents volatilization of written data, the 1T1C memory is expected to replace an SRAM or the like.

Since the semiconductor device according to this embodiment is formed using the ferroelectric layer according to the above embodiment, the ferroelectric layer can be crystallized at a low temperature. Therefore, the semiconductor device can be embedded with another semiconductor device such as a MOS transistor. The semiconductor device according to this embodiment is not limited to the above-described semiconductor devices, and may also be applied to a 2T2C ferroelectric memory device or the like.

4.2. Piezoelectric Device

An example in which the ferroelectric layer according to the above embodiment is applied to a piezoelectric device is described below.

Figure 17:
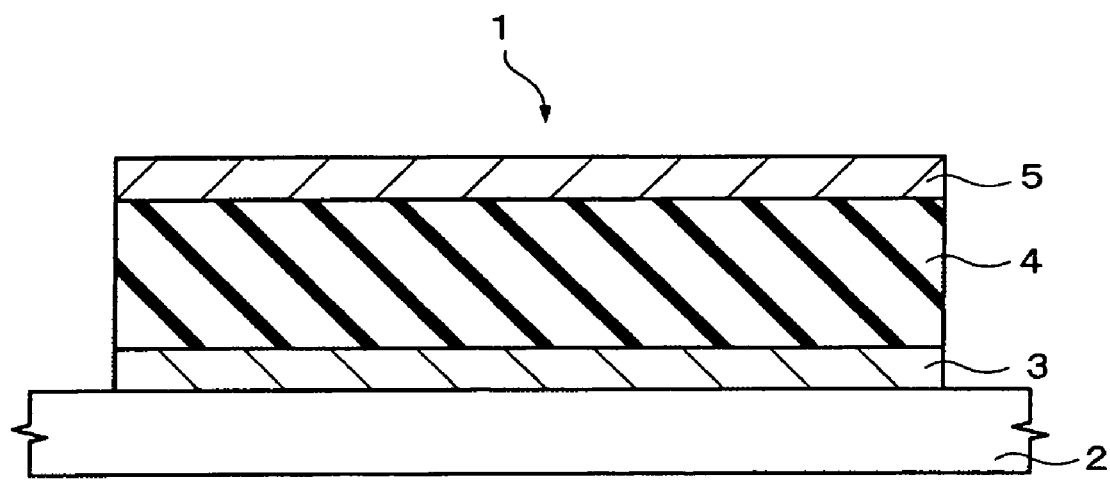
FIG. 17 is a cross-sectional view schematically showing a piezoelectric device according to one embodiment of the invention.

FIG. 17 is a cross-sectional view showing a piezoelectric device 1 including a ferroelectric layer formed by the manufacturing method according to the above embodiment. The piezoelectric device 1 includes a substrate 2, a lower electrode 3 formed on the substrate 2, a piezoelectric film (ferroelectric layer according to the above embodiment) 4 formed on the lower electrode 3, and an upper electrode 5 formed on the piezoelectric film 4.

As the substrate 2, a silicon substrate may be used. In this embodiment, a (110)-oriented single crystal silicon substrate is used as the substrate 2. A (100)-oriented single crystal silicon substrate or a (111)-oriented single crystal silicon substrate may also be used as the substrate 2. In addition, a substrate obtained by forming an amorphous silicon oxide film such as a thermal oxide film or a natural oxide film on the surface of a silicon substrate may also be used as the substrate 2. The substrate 2 is processed to form ink cavities 521 in an inkjet recording head 50 as described later (see FIG. 18).

The lower electrode 3 is an electrode for applying a voltage to the piezoelectric film 4. The lower electrode 3 may be formed to have a planar shape the same as that of the piezoelectric film 4, for example. When two or more piezoelectric devices 1 are formed in the inkjet recording head 50 described later (see FIG. 18), the lower electrode 3 may be formed to function as a common electrode for the piezoelectric devices 1. The lower electrode 3 is formed to have a thickness of about 100 to 200 nm, for example.

The lower electrode 3 and the upper electrode 5 may be formed by a sputtering method, a vacuum deposition method, or the like. The lower electrode 3 and the upper electrode 5 are formed of platinum (Pt), for example. The materials for the lower electrode 3 and the upper electrode 5 are not limited to Pt. For example, iridium (Ir), iridium oxide ($IrO_x$), titanium (Ti), $SrRuO_3$, or the like may also be used.

Since the piezoelectric device according to this embodiment is formed using the ferroelectric layer according to the above embodiment, the piezoelectric film can be crystallized at a low temperature. Therefore, the piezoelectric device can be embedded with another semiconductor device.

4.3. Inkjet Recording Head and Inkjet Printer

Figure 18:
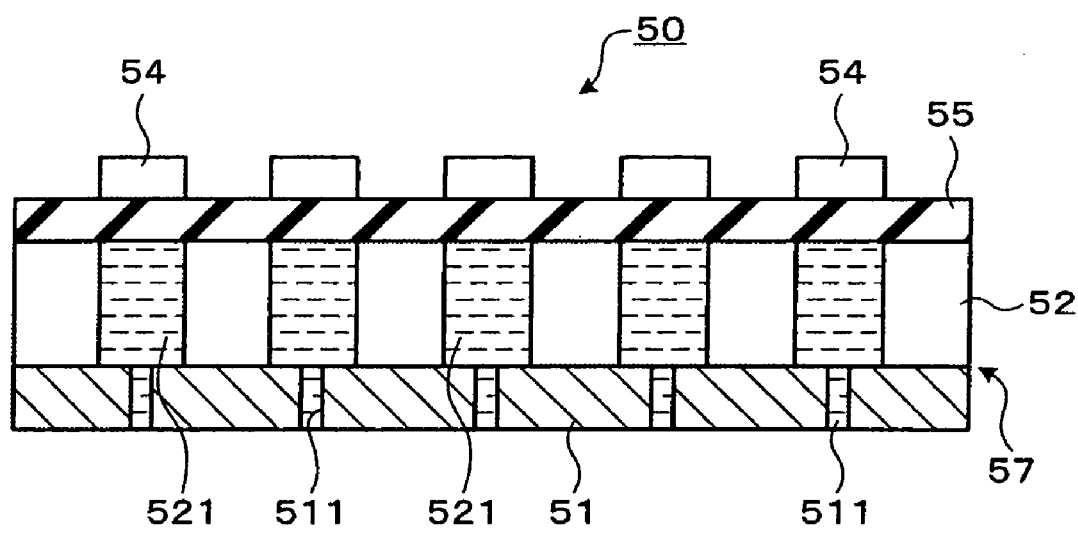
FIG. 18 is a schematic view of an inkjet recording head according to one embodiment of the invention.
Figure 19:
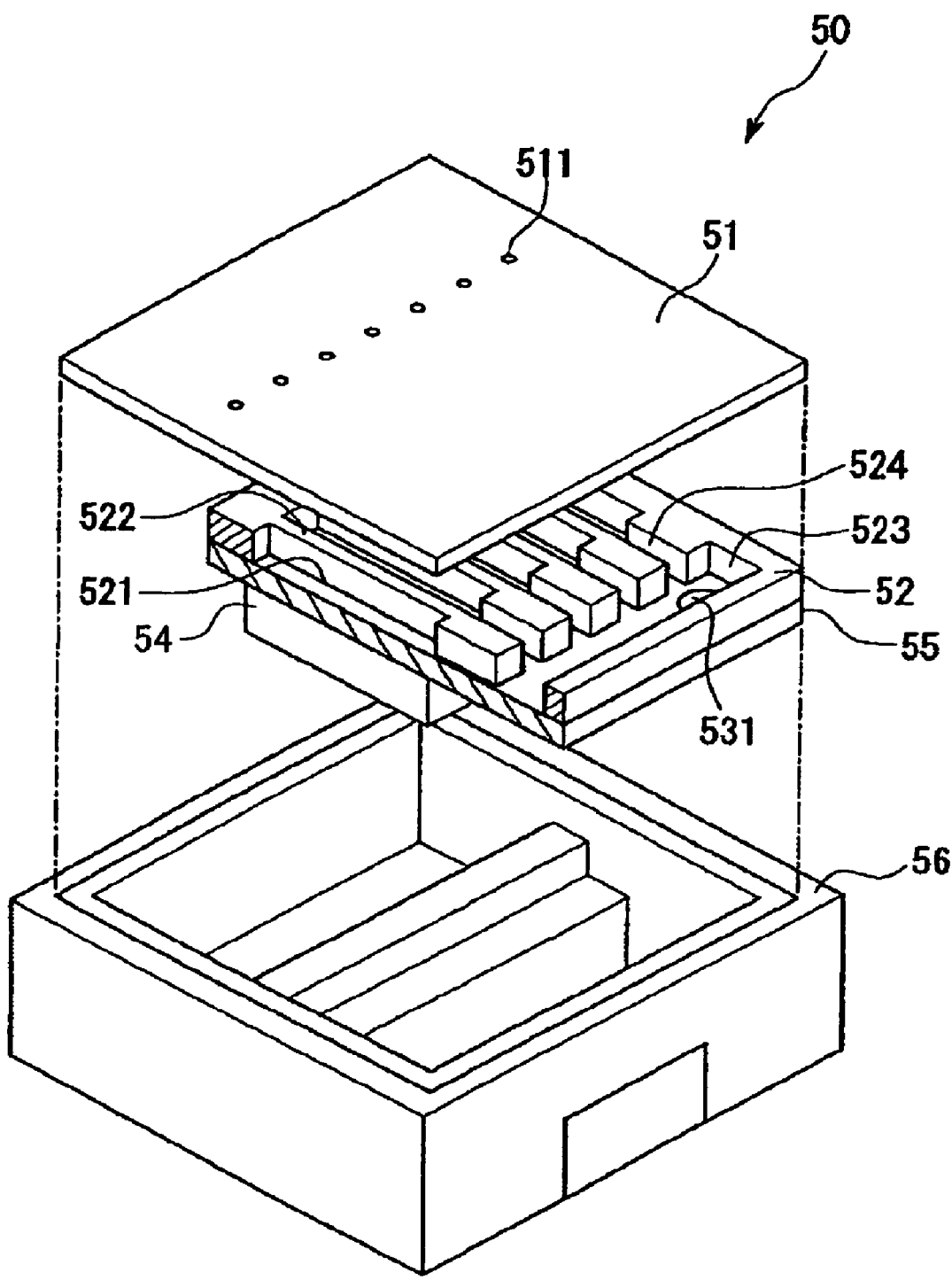
FIG. 19 is an exploded perspective view of an inkjet recording head according to one embodiment of the invention.
Figure 20:
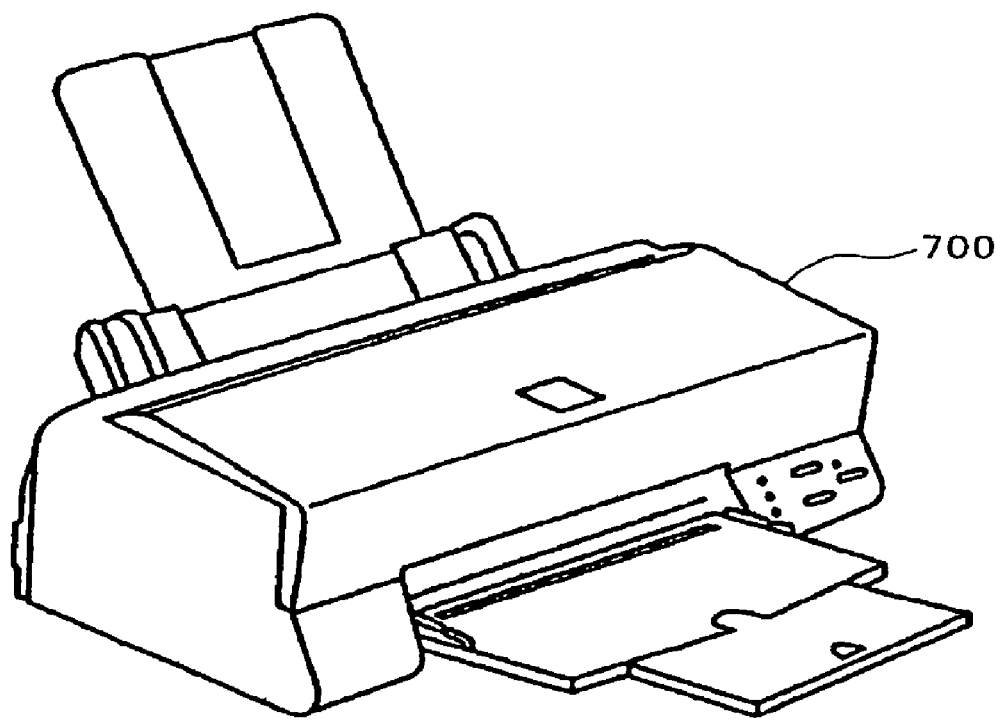
FIG. 20 is a schematic view of an inkjet printer according to one embodiment of the invention.

An inkjet recording head in which the above-described piezoelectric device functions as a piezoelectric actuator, and an inkjet printer including the inkjet recording head are described below. The inkjet recording head and the inkjet printer are described below in this order. FIG. 18 is a side cross-sectional view showing a schematic configuration of the inkjet recording head according to this embodiment, and FIG. 19 is an exploded perspective view of the inkjet recording head which is reversed in the vertical direction. FIG. 20 shows an inkjet printer 700 including the inkjet recording head according to this embodiment.

4.3.1 Inkjet Recording Head

As shown in FIG. 18, the inkjet recording head 50 includes a head body (base) 57 and a piezoelectric section 54 formed over the head body 57. The piezoelectric device 1 shown in FIG. 17 is provided in the piezoelectric section 54. The piezoelectric device 1 is formed by stacking the lower electrode 3, the piezoelectric film (ferroelectric layer according to the above embodiment) 4, and the upper electrode 5 in that order. The piezoelectric film 4 is a film formed using the raw material solution described in "1. Ferroelectric Layer". In the inkjet recording head, the piezoelectric section 54 functions as a piezoelectric actuator.

The inkjet recording head 50 includes a nozzle plate 51, an ink chamber substrate 52, an elastic film 55, and the piezoelectric section 54 bonded to the elastic film 55. These components are accommodated in a housing 56. The inkjet recording head 50 forms an on-demand type piezo jet head.

The nozzle plate 51 is formed of a stainless steel rolled plate or the like, in which a number of nozzles 511 for discharging ink droplets are formed in a row. The pitch between the nozzles 511 is appropriately determined depending on the printing precision.

The ink chamber substrate 52 is attached to (secured on) the nozzle plate 51. In the ink chamber substrate 52, cavities (ink cavities) 521, a reservoir 523, and supply ports 524 are partitioned by the nozzle plate 51, a side wall (partition wall) 522, and the elastic film 55. The reservoir 523 temporarily stores ink supplied from an ink cartridge (not shown). The ink is supplied to each cavity 521 from the reservoir 523 through the supply ports 524.

As shown in FIGS. 18 and 19, the cavity 521 is disposed corresponding to the nozzle 511. The volume of the cavity 521 can be changed by vibration of the elastic film 55. The cavity 521 is configured to discharge the ink as a result of a change in volume.

A (110)-oriented single crystal silicon substrate is used as the base material for the ink chamber substrate 52. Since the (110)-oriented single crystal silicon substrate is suitable for anisotropic etching, the ink chamber substrate 52 can be easily and reliably formed. The single crystal silicon substrate is used so that the surface on which the elastic film 55 is formed is the (110) plane.

The elastic film 55 is disposed on the ink chamber substrate 52 on the side opposite to the nozzle plate 51. The piezoelectric sections 54 are disposed on the elastic film 55 on the side opposite to the ink chamber substrate 52. As shown in FIG. 19, a communication hole 531 is formed through the elastic film 55 in the thickness direction at a specific position of the elastic film 55. The ink is supplied to the reservoir 523 from the ink cartridge through the communication hole 531.

The piezoelectric section is electrically connected with a piezoelectric device driver circuit (not shown), and is actuated (vibrate or deformed) based on a signal from the piezoelectric device driver circuit. Specifically, the piezoelectric section 54 functions as a vibration source (head actuator). The elastic film 55 vibrates due to vibration (deflection) of the piezoelectric section 54, and functions to momentarily increase the pressure inside the cavity 521.

An example of the inkjet recording head which discharges ink is described above. However, this embodiment aims at a liquid jet head using a piezoelectric device and a liquid jet device in general. As the liquid jet head, a recording head used for an image recording device such as a printer, a color material jet head used to manufacture a color filter for a liquid crystal display or the like, an electrode material jet head used to form an electrode of an organic EL display, a field emission display (FED), or the like, a bio-organic substance jet head used to manufacture a bio-chip, and the like can be given.

The piezoelectric device according to this embodiment is not limited to the above-described application examples. The piezoelectric device according to this embodiment may be applied to various products such as a piezoelectric pump, a surface acoustic wave (SAW) device, a thin-film piezoelectric resonator, a frequency filter, and an oscillator (e.g. voltage-controlled SAW oscillator).

Although some embodiments of the invention have been described, the invention is not limited to the above embodiments, and various modifications can be made within the scope of the invention.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A method of manufacturing a ferroelectric layer, comprising:
    forming a first ferroelectric layer that includes lead zirconate titanate above a base by a MOCVD (Metalorganic Chemical Vapor Deposition) method; and
    forming a second ferroelectric layer that includes lead zirconate titanate niobate above the first ferroelectric layer by a liquid phase method using a precursor composition, the precursor composition being obtained by mixing a raw material including at least Pb, Zr, Ti and Nb, a polycarboxylic acid ester, and an alcohol, and
    a ratio of the polycarboxylic acid ester to the raw material is set at: $1 \leqq$ (molar ion concentration of polycarboxylic acid ester)/(total ion concentration of raw material).

2. The method of manufacturing a ferroelectric layer as defined in claim 1:
    wherein the base includes:
        a silicon substrate;
        an insulating layer formed above the silicon substrate;
        a hole formed in the insulating layer and connected to the silicon substrate;
        a plug formed in the hole; and
        a lower electrode layer formed above the plug.

3. The method of manufacturing a ferroelectric layer as defined in claim 1,
    wherein the second ferroelectric layer is formed by using a precursor composition including a precursor; and
    wherein the precursor includes at least zirconium and titan and includes an ester bond.

4. The method of manufacturing a ferroelectric layer as defined in claim 1,
    wherein the second ferroelectric layer is shown by a general formula $Pb((Zr,Ti)_{1-x}Nb_x)O_3$ where Nb is in a range of $0.1 \leqq x \leqq 0.3$.

5. The method of manufacturing a ferroelectric layer as defined in claim 1,
    wherein the second ferroelectric layer includes Si in an amount of 0.5 mol % or more.

6. The method of manufacturing a ferroelectric layer as defined in claim 4,
    wherein Si is present in an A site.

7. The method of manufacturing a ferroelectric layer as defined in claim 2, wherein the step of manufacturing the lower electrode layer includes:
    forming an amorphous conductive material layer on the plug; and
    forming a conductive layer formed of a platinum metal above the amorphous conductive material layer.

8. The method of manufacturing a ferroelectric layer as defined in claim 7, wherein the step of manufacturing the conductive layer includes:
    forming a first conductive layer that includes at least one of an iridium layer and an iridium oxide layer above the amorphous conductive material layer; and
    forming a second conductive layer formed of platinum above the first conductive layer.

9. The method of manufacturing a ferroelectric layer as defined in claim 1, further comprises forming an upper electrode layer above the second ferroelectric layer.

10. The method of manufacturing a ferroelectric layer as defined in claim 1, used for a method of manufacturing an electronic instrument.

11. The method of manufacturing a ferroelectric layer as defined in claim 1,
    wherein the first ferroelectric layer functions as a buffer layer.

* * * * *